United States Patent
Shi et al.

(10) Patent No.: US 8,395,837 B2
(45) Date of Patent: Mar. 12, 2013

(54) RELEASING AND POST-RELEASING PROCESSES IN FABRICATIONS FOR MICROMIRROR ARRAY DEVICES

(75) Inventors: Hongqin Shi, San Jose, CA (US); Gregory Schaadt, Santa Clara, CA (US); James C. Dunphy, San Jose, CA (US); Dmitri Simonian, Sunnyvale, CA (US); John D. Porter, Oakland, CA (US)

(73) Assignee: Texas Instruments Incorporated, Dallas, TX (US)

( * ) Notice: Subject to any disclaimer, the term of this patent is extended or adjusted under 35 U.S.C. 154(b) by 1585 days.

(21) Appl. No.: 11/734,458

(22) Filed: Apr. 12, 2007

(65) Prior Publication Data

US 2012/0184067 A1    Jul. 19, 2012

Related U.S. Application Data

(63) Continuation-in-part of application No. 10/713,671, filed on Nov. 13, 2003, now abandoned.

(60) Provisional application No. 60/792,238, filed on Apr. 13, 2006.

(51) Int. Cl.
*G02B 26/00* (2006.01)

(52) U.S. Cl. .......................... 359/291; 359/290

(58) Field of Classification Search .................. 359/196, 359/223, 224, 225, 226, 290, 291
See application file for complete search history.

(56) References Cited

U.S. PATENT DOCUMENTS

| | | | |
|---|---|---|---|
| 6,650,461 B2 * | 11/2003 | Atobe et al. | 359/291 |
| 6,666,979 B2 * | 12/2003 | Chinn et al. | 216/2 |
| 2005/0157375 A1 * | 7/2005 | Doan et al. | 359/291 |
| 2005/0161757 A1 * | 7/2005 | Cho et al. | 257/433 |
| 2006/0278254 A1 * | 12/2006 | Jackson | 134/21 |

OTHER PUBLICATIONS

Ashurst et al., Wafer Level Anti-Stiction Coatings for MEMS, May 6, 2003, Sensors and Actuators A 104, pp. 213-221.*

* cited by examiner

*Primary Examiner* — Ricky Mack
*Assistant Examiner* — Mahidere Sahle
(74) *Attorney, Agent, or Firm* — Warren L. Franz; Wade J. Brady, III; Frederick J. Telecky, Jr.

(57) ABSTRACT

A releasing and post-releasing method for making a micromirror device and a micromirror array device are disclosed herein. The releasing method removes the sacrificial materials in the micromirror and micromirror array so as to enabling movements of the movable elements in the micromirror and micromirror array device. The post-releasing method is applied to improve the performance and quality of the released micromirrors and micromirror array devices.

12 Claims, 13 Drawing Sheets

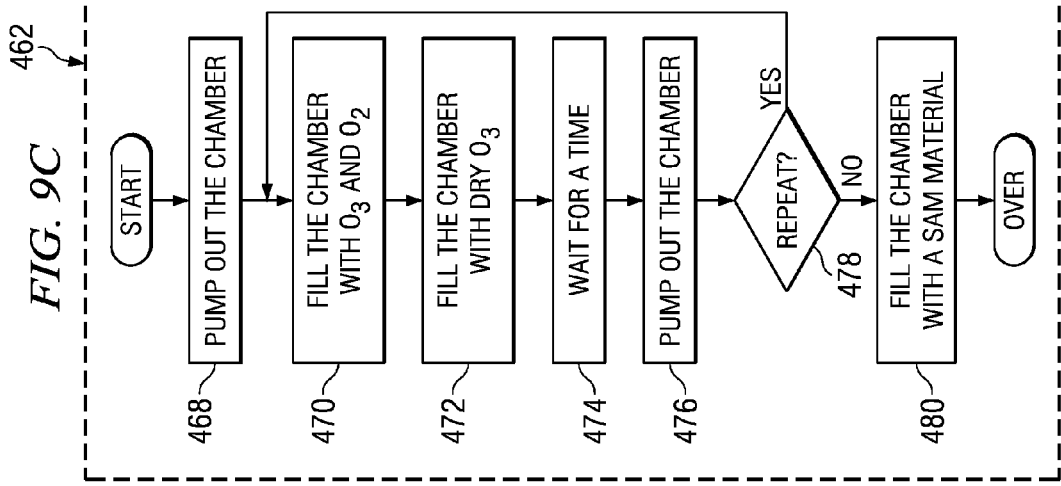
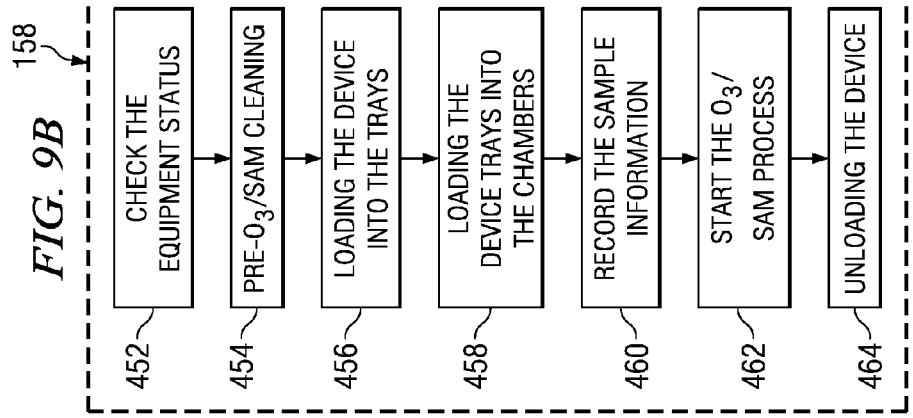
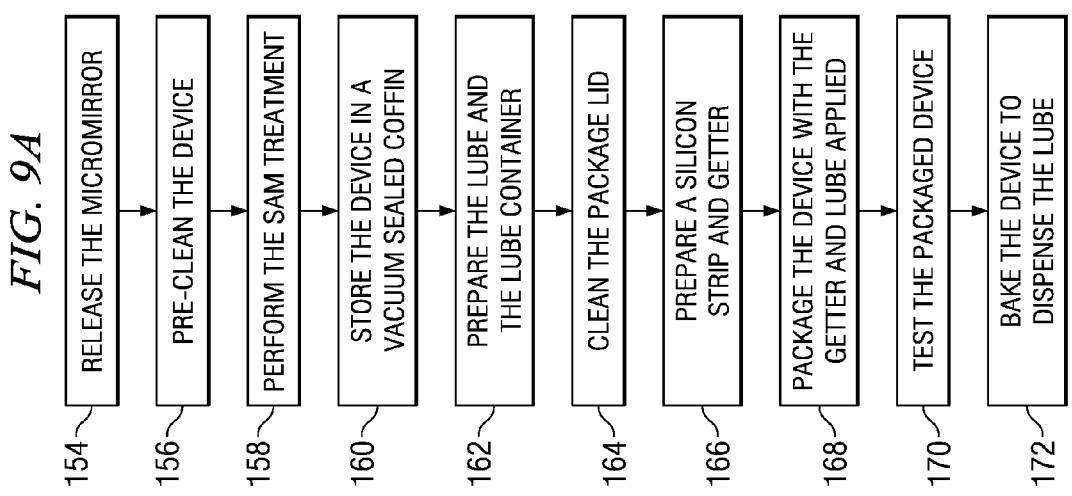

US 8,395,837 B2

RELEASING AND POST-RELEASING PROCESSES IN FABRICATIONS FOR MICROMIRROR ARRAY DEVICES

CROSS-REFERENCE TO RELATED PATENT APPLICATIONS

This application claims priority under 35 USC §119(e)(1) of provisional Application No. 60/792,238, filed Apr. 13, 2006, which is a continuation-in-part of co-pending U.S. patent application Ser. No. 10/713,671, filed Nov. 13, 2003, the subject matter being incorporated herein by reference in entirety.

TECHNICAL FIELD OF THE INVENTION

The present invention is generally related to the art of microelectromechanical devices, and more particularly, to releasing and post-releasing processes in fabrications for micromirror array devices.

BACKGROUND OF THE INVENTION

Microelectromechanical (MEMS) devices have found many applications in basic signal transductions. For example, MEMS-based spatial light modulators are transducers that modulate incident light in spatial patterns in response to optical or electrical inputs. The incident light may be modulated in phase, intensity, polarization, or direction. This modulation may be accomplished through the use of a variety of materials exhibiting magneto-optic, electro-optic, or elastic properties. Such spatial light modulators have many applications, including optical information processing, display systems, and electrostatic printing.

A micromirror-based spatial light modulator is a spatial light modulator that consists of an array of micromirrors and an array of electrodes and circuits. A typical micromirror has a deformable reflective mirror plate attached to a deformable hinge that is held on a substrate such that the mirror plate can rotate to different positions. According to the different rotation positions of the mirror plate, operation states, such as ON and OFF states in a binary operation mode, are defined. In the ON state, incident light is reflected so as to produce a "bright" pixel on a display target, and in the OFF state, incident light is reflected to produce a "dark" pixel on the display target. In an application of displaying an image represented by image pixels having "bright" and "dark" values, the micromirrors are associated with the image pixels, and the micromirrors are individually set to the ON or OFF states according to the "bright" or "dark" values of the image pixels associated with micromirrors. The collective effect of the reflection from the micromirrors at the ON and OFF states for a given incident light is reproduction of the image on the display target.

The deflections of the mirror plates are accomplished through the electrodes and circuits connected to the electrodes. Specifically, each mirror plate of a micromirror is electrostatically coupled to one or more electrodes such that an electrostatic field can be established between the mirror plate and the electrode(s) for deflecting the mirror plate. The strength of the electrostatic field is determined by the voltage of the electrode, and voltage of the electrode is controlled by the output voltage of the circuit, which can be a memory cell, such as a DRAM. With this configuration, the micromirrors can thus be individually addressed and the mirror plates of the micromirrors can be individually deflected.

Therefore, a method for making the micromirror device, micromirror array device, and spatial light modulator comprising the micromirror array devices is desired.

SUMMARY OF THE INVENTION

In view of the foregoing, the present invention discloses methods of making a micromirror device and micromirror array device comprising an array of micromirror devices. In particular, the present invention discloses methods of releasing the micromirrors and micromirror array devices by removing the sacrificial materials deposited therein during fabrications, and methods of processing the released micromirror devices and micromirror array devices so as to improve the performance thereof.

The objects and advantages of the present invention will be obvious, and in part appear hereafter and are accomplished by the present invention. Such objects of the invention are achieved in the features of the independent claims attached hereto. Preferred embodiments are characterized in the dependent claims.

BRIEF DESCRIPTION OF THE DRAWINGS

The accompanying drawings are illustrative and are not to scale. In addition, some elements are omitted from the drawings to more clearly illustrate the embodiments. While the appended claims set forth the features of the present invention with particularity, the invention, together with its objects and advantages, may be best understood from the following detailed description taken in conjunction with the accompanying drawings, in which:

FIG. 1b is an exploded view of a micromirror device of the micromirror array device in FIG. 1a;

FIG. 4a illustrates a semiconductor wafer having a plurality of electrode dies each of which comprises an array of addressing electrodes as shown in FIG. 3a;

FIGS. 9a to 9c illustrate a flow chart showing the steps executed for releasing the micromirror in FIG. 2 and the fabrication processes performed after releasing for improving the performance and reliability of the micromirror device;

DETAILED DESCRIPTION OF THE INVENTION

The present invention discloses methods for releasing micromirrors and micromirror array devices each having an array of micromirrors; and methods of processes after releasing so as to improve the performance and qualities of the micromirror devices and micromirror array devices. In the following, the present invention will be discussed with reference to drawings of specific examples. However, it will be understood that the following discussion is for demonstration purposes, and should not be interpreted as a limitation. Instead, any variations without departing from the sprit of the invention are applicable. For example, the present invention is also applicable for fabricating other micromirror devices that are not discussed in the following, and other microelectromechanical devices with or without deflectable elements.

Micromirror and Micromirror Array Devices

Figure 1A:
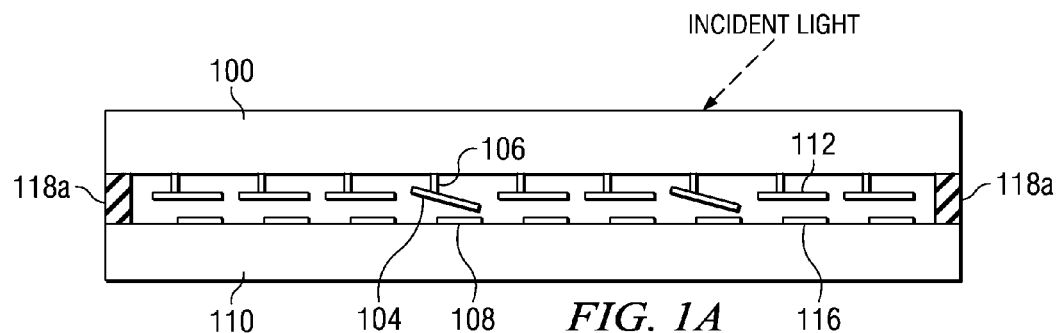
FIG. 1a schematically illustrates a cross-sectional view of a micromirror array of a device comprising an array of micromirrors.

Turning to the drawings, FIG. 1*a* illustrates a cross-sectional view of an exemplary spatial light modulator having an array of micromirror devices, in which embodiments of the invention are applicable. For simplicity purposes, only nine micromirror devices are illustrated. In general, the micromirror array of a spatial light modulator may consist of thousands or millions of micromirrors, the total number of which determines the resolution of the displayed images. For example, the micromirror array of the spatial light modulator may have 640×480 (VGA) or more, such as 800×600 (SVGA) or more, 1024×768 (XGA) or more, 1280×1024 (SXGA) or more, 1280×720 or more, 1400×1050 or more, 1600×1200 (UXGA) or more, and 1920×1080 or more, or even larger number of micromirrors. In other applications, the micromirror array may have less number of micromirrors.

The diameter of the micromirror array is preferably from 0.55 inch to 0.8 inch, more preferably from 0.65 to 0.85 inch, and more preferably around 0.7 inch. The micromirror devices each have a characteristic dimension in the order of microns, such as 100 micros or less, 50 microns or less, and 15 microns or less. The micromirror devices are arranged in arrays preferably with a pitch of 10.16 microns or less, such as from 4.38 to 10.16 microns. The gap between the adjacent micromirror devices is preferably 1.5 microns or less, such as 1 micron or less, 0.5 micron or less, more preferably from 0.1 to 0.5 micron, as set forth in U.S. patent application Ser. No. 10/627,302 filed Jul. 24, 2003, the subject matter being incorporated herein by reference in entirety.

As shown in FIG. 1*a*, each micromirror device comprises a reflective deflectable mirror plate (e.g. mirror plate 104) attached to a deformable hinge that is held by a post (e.g. post 106) formed on a substrate (e.g. substrate 100). With such configuration, the mirror plate is capable of rotating relative to the substrate (e.g. substrate 100) on which the mirror plate is held. The rotation (deflection) of the mirror plate is accomplished through an addressing electrode (e.g. addressing electrode 108) that is placed proximate to and associated with the mirror plate. The addressing electrode can be formed on substrate 110 that is a semiconductor substrate on which standard integrated circuits and semiconductor devices can be fabricated. In operation, electrical voltages are applied to the mirror plate and the associated addressing electrode so as to generate an electrostatic field between the mirror plate and addressing electrode. Such electrostatic field yields an electric force having a strength determined upon many factors, such as the magnitude of the voltage differences between the mirror plate and addressing electrode and the vertical distance between the mirror plate and addressing electrode. The electrostatic force causes an electrostatic torque to the mirror plate, and deflecting the mirror plate relative to the substrate (e.g. substrate 100). By adjusting the magnitude of the voltage applied to the addressing electrode, different rotation angles of the mirror plate can be achieved. For example, given the mirror plates 104 and 112, different voltages applied on addressing electrode 108 that is associated with mirror plate 104 and on addressing electrode 116 that is associated with mirror plate 112 results in different rotation (deflection) positions of mirror plates 104 and 112.

In the example shown in FIG. 1*a*, the array of mirror plates is formed on substrate 100 that is transmissive to visible light; and the array of addressing electrodes is formed on substrate 110 that is a standard semiconductor substrate. The two substrates can be bonded together using a bonding material, such as a spacer 118*a*, so as to maintain a constant and uniform distance between the mirror plates and addressing electrodes that are enclosed within the gap between the two substrates.

Figure 1B:
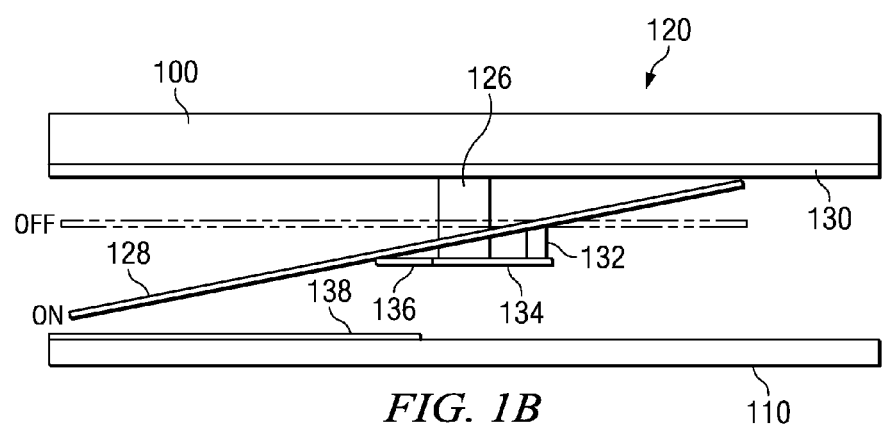

The micromirror device of the spatial light modulator is better illustrated in FIG. 1*b*. Referring to FIG. 1*b*, micromirror device 120 comprises light transmissive substrate 100 and semiconductor substrate 110. Post 126 is formed on substrate 100. Deformable hinge 134 is connected to and held by the post on substrate 100. Reflective deflectable mirror plate 128 is attached to the deformable hinge via hinge contact 132 such that the mirror plate is deflectable relative to substrate 100. For deflecting the mirror plate, addressing electrode 138 on substrate 110 is placed proximate to the mirror plate such that the electrostatic field can be established between the mirror plate and the addressing electrode.

The micromirror as shown in FIG. 1b may have other alternative features. For example, light transmissive electrode 130 for deflecting the mirror plate towards substrate 100 can be provided. For preventing unintentional electrical short between the mirror plate and electrode 130, such as the end of the mirror plate and electrode 130 when the mirror plate is deflected towards substrate 110 (the ON state as shown in the figure), a light transmissive and electrically conductive layer may be coated on the light transmissive electrode 130. Alternative to the light transmissive electrode, optical films for improving the optical properties, such as an anti-reflection film for enhancing the transmission of the incident light (e.g. visible light); and light blocking/absorbing materials (e.g. in the form of strip, frame, segments, or combinations thereof) can be coated on the light transmissive substrate 100.

The mirror plate can be attached to the deformable hinge via hinge contact wherein the contact point is away from the mass center of the mirror plate such that the rotation axis along which the mirror plate rotates is not coincident with any diagonals of the mirror plate (but may or may not be parallel to a diagonal of the mirror plate); and the mirror plate is thus capable of rotating asymmetrically. That is, the maximum achievable angle (e.g. the ON state angle) of the mirror plate rotating in one direction is larger than that (e.g. the OFF state angle) of the mirror plate in rotating along the opposite direction. Alternatively, the mirror plate can be attached to the deformable hinge such that the mirror plate is capable of rotating symmetrically—that is the maximum achievable angles in both directions are substantially the same. This can be accomplished by attaching the mirror plate to the deformable hinge at an attachment point that is substantially at the mass center of the mirror plate, which is not shown in the figure.

Regardless of whether the attachment point is at or away from the mass center of the mirror plate, the mirror plate and deformable hinge can be formed on different planes when the mirror plate is not deflected. That is, the mirror plate and deformable hinge form a gap along the normal direction of the mirror plate when the mirror plate is not deflected, as that shown in the figure. Alternatively, the mirror plate and deformable hinge can be formed on the same plane. In particular, the mirror plate and deformable hinge can be derived from a same material. For example, the mirror plate and hinge can be derived from a single crystal, such as single crystal silicon.

Stopping mechanisms, such as stopper 136, can be alternatively provided for limiting the rotations of the mirror plate when the mirror plate rotates to desired angles. For example, stopper 136 in the figure stops the rotation of the mirror plate when the mirror plate rotates to the desired ON state angle, such as 10° degrees or more, or 12° degrees or more, or 14° degrees or more, or 16° degrees or more. Of course, other stoppers can be alternatively provided, for example, a stopper for defining the OFF state of the mirror plate. In other embodiments, substrates 100 and 110 can function as stoppers.

As a feature of the invention, only one single addressing electrode (e.g. addressing electrode 138) is associated with each mirror plate for deflecting the mirror plate according to the image data of desired images (e.g. bitplane data). Such addressing electrode is preferably, but not required, placed such that the addressing electrode extends beyond the furthest point of the mirror plate from the mass center of the mirror plate when the mirror plate is not deflected.

In the examples shown in FIGS. 1a and 1b, the mirror plates and addressing electrodes are formed on separate substrates (e.g. semiconductor substrate 138 and light transmissive substrate 100). Alternatively, the mirror plate and addressing electrode can be formed on the same substrate, such as the semiconductor substrate (e.g. substrate 138).

Figure 2:
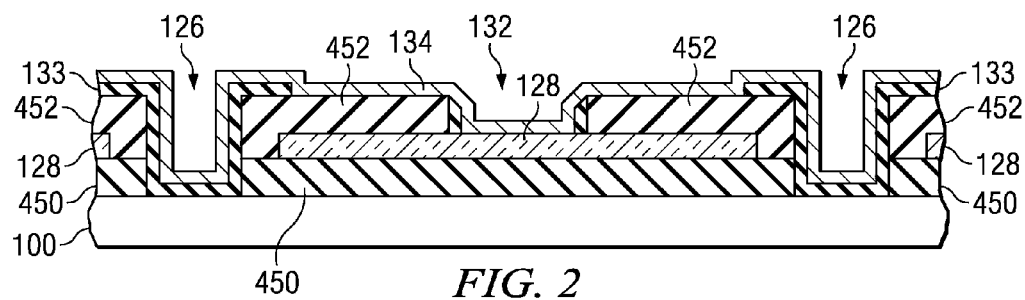
FIG. 2 schematically illustrates the micromirror device in FIG. 1b during an exemplary fabrication before releasing.

The micromirror devices as discussed above can be fabricated in many ways. An exemplary fabrication method for making a micromirror in FIG. 1b is demonstratively illustrated in FIG. 2. Referring to FIG. 2, first sacrificial material 450, such as amorphous silicon is deposited on substrate 100 that is transmissive to visible light. A mirror plate layer, or multiple mirror plate layers (e.g. a metallic reflective layer, a mechanical enhancing layer, and other functional layers, such as a barrier layer) are deposited on the first sacrificial layer and patterned into mirror plate 128 with the desired shape. Second sacrificial layer 452 is then deposited on the patterned mirror plate and first sacrificial layer following by patterning so as to form posts 126 and hinge contact 132. Hinge support layer(s) 133 are deposited and patterned so as to form a hinge support (if desired) and posts 126. The side walls of hinge contact 132 are also filled with the hinge support material(s) to improve the mechanical properties of the hinge contact. Exemplary hinge support layers are $TiN_x$, $SiN_x$, or a combination thereof.

Hinge layer 134, such as a layer comprising $TiN_x$, is then deposited and patterned so as to form the deformable hinge. It is preferred that the hinge comprises an electrically conductive material, and such electrically conductive material is electrically connected to the electrically conductive layer of the mirror plate at the hinge contact (e.g. as that shown in the figure) such that electrical voltage signals can be applied to the mirror plate through the deformable hinge and hinge contact.

After forming the functional members of the micromirror, the first and second sacrificial layers are removed by etching with a selected chemical etchant. For example, when the sacrificial material is amorphous silicon, a spontaneous vapor phase chemical etchant can be used to remove the sacrificial materials. Examples of such chemical etchants are interhalogens, noble gas halides, HF, and other suitable chemical etchants, which will be discussed in detail afterwards with reference to FIG. 9a. The etching can be performed with or without external power, or may or may not be energized.

The released micromirror after removal of the sacrificial layers is then assembled to the addressing electrode so as to form a micromirror device.

Figure 3A:
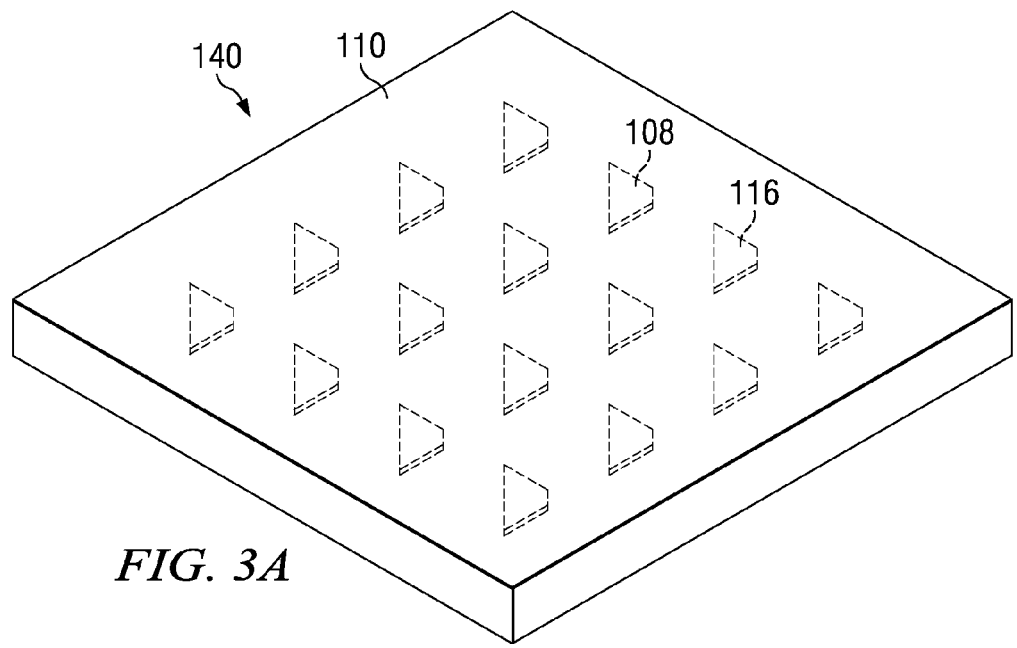
FIG. 3a illustrates a perspective view of a semiconductor substrate having an array of addressing electrodes.
Figure 3B:
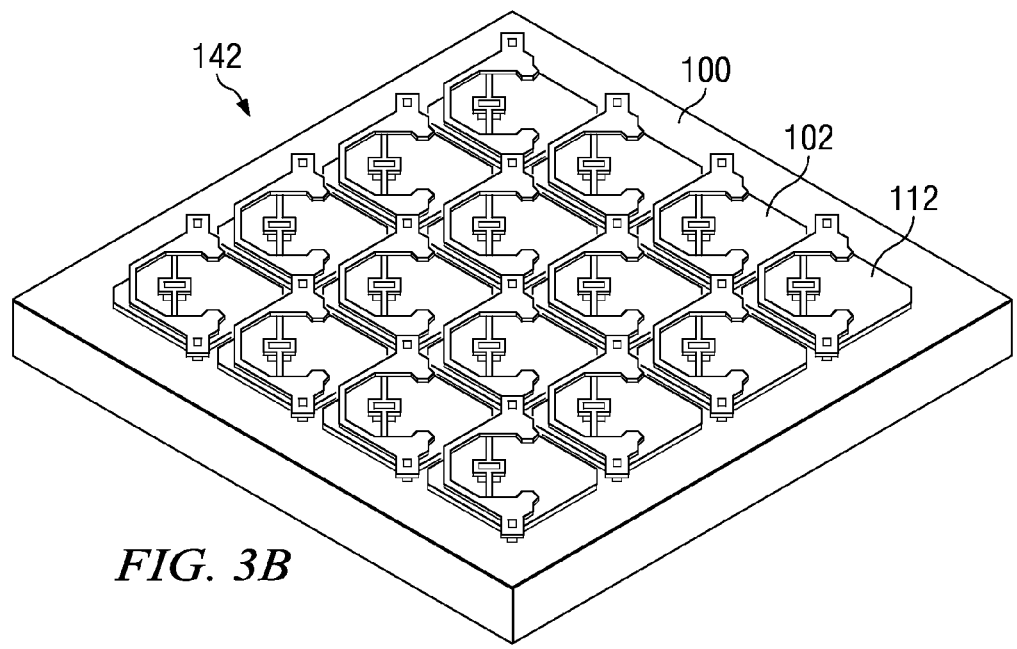
FIG. 3b illustrates a perspective view of a light transmissive substrate on having an array of deflectable micromirrors.

The above fabrication method is discussed with reference to making one single micromirror device. However, a micromirror array device having an array of micromirror devices can be fabricated in the same method. Referring to FIGS. 3a and 3b, FIG. 3a demonstratively illustrates an array of addressing electrodes (e.g. addressing electrodes 116 and 108) on semiconductor substrate 110. For simplicity purposes, only 4×4 addressing electrodes are shown in the figure. FIG. 3b schematically illustrates an array of micromirrors (e.g. micromirrors 102 and 112) each having a reflective mirror plate formed on light transmissive substrate 100. The micromirrors can be fabricated with the fabrication method discussed with reference to FIG. 2. After releasing the sacrificial materials, the released micromirrors are assembled to the array of addressing electrodes on semiconductor substrate 110 such that each mirror plate of the micromirrors is associated with an addressing electrode of the array of addressing electrodes. The assembled micromirrors and addressing electrodes are often referred to as a micromirror array device.

Figure 4A:
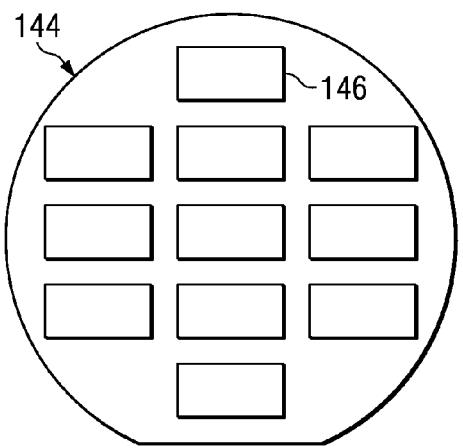
Figure 4B:
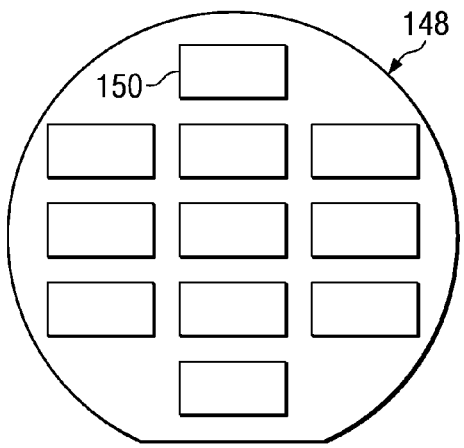
FIG. 4b illustrates a light transmissive wafer having a plurality of micromirror dies each of which has an array of deflectable micromirrors as shown in FIG. 3b.

The micromirror array devices can be fabricated on wafer level, as shown in FIGS. 4a and 4B. Referring to FIG. 4a, a plurality of electrode dies (e.g. electrode die 146) each having an array of addressing electrodes (e.g. addressing electrode array 140 in FIG. 3*a*) is fabricated on semiconductor wafer 144. A plurality of mirror dies (e.g. mirror die 150) each having an array of micromirrors (e.g. micromirror array 142 in FIG. 3*b*) is fabricated and released on light transmissive wafer 148. The electrode dies and micromirror dies are assembled together by assembling each micromirror die with an electrode die. The assembled micromirror and electrode dies are then singulated. A singulated die assembly is demonstratively illustrated in FIG. 5.

Figure 5:
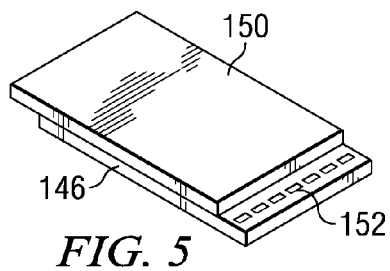
FIG. 5 illustrates a perspective view of a singulated die assembly comprising a micromirror die and an addressing electrode die from the light transmissive wafer in FIG. 4b and semiconductor wafer in FIG. 4a, respectively.

Referring to FIG. 5, light transmissive substrate 150 having formed thereon an array of reflective deflectable mirror plates is assembled to semiconductor substrate 146 having an array of addressing electrodes. The two substrates can be offset in one direction such that a portion of the semiconductor substrate can be exposed forming a ledge, on which a plurality of electrical contacts 152 can be formed. The electrical contacts can be used to deliver external signals to the mirror plates and addressing electrodes enclosed within the gap between the two substrates.

The released micromirror device, however, may suffer from stiction, which limits the reliability and widespread use of the micromirror device. Adhesion is a result of the dominance of surface and interfacial forces, such as capillary, chemical bonding, electrostatic, and van der Waals forces, over mechanical forces which tend to separate microelectromechanical components. When mechanical restoring forces cannot overcome adhesive forces, the microelectromechanical devices are said to suffer from stiction. Stiction failures in contacting microstructures, such as micromirror devices, can occur after the first contacting event (often referred to as initial stiction), or as a result of repeated contacting events (often referred to as in-use stiction). Initial stiction is often associated with surface contamination (e.g., residues of bonding materials or photoresist), or with high energy of contacting surfaces (e.g., clean oxidized silicon or metallic surfaces). For the case of in-use stiction, each time one part of the microstructure (e.g. mirror plate of a micromirror device) touches the other (e.g. stopping mechanism) or the substrate, the contact force grows and ultimately becomes too large for the restoring force to overcome. In this case, the device remains in one state indefinitely. This phenomenon can arise from a variety of underlying mechanisms, such as contact area growth, creation of high-energy surface by micro-wear, and surface charge separation etc.

For the above and other reasons, the released micromirror devices are desired to be cleaned and treated with anti-stiction materials. An exemplary approach for cleaning and/or coating and/or lubricating the surfaces of micromirror devices is proposed herein. In the cleaning process, a cleaning agent, such as a gas mixture containing ozone, is applied to the surface to remove contaminants, such as organic residues on the surface. The cleaning agent may comprise humid ozone gas and dry ozone gas. "Humid ozone gas," is a mixture of water vapor and ozone gas. "Dry ozone gas," is ozone gas without significant amounts of water vapor. In the coating process, one or more vapor phase agents are introduced to the surface of the microstructure. The coating agents react with the surface to form a chemically bonded surface layer.

The cleaning and coating processes can be performed on the assembled micromirror devices. For this purpose, a micro-opening having a characteristic dimension around 10 micrometers or less is formed so as to allow the cleaning agent and coating agent (or precursors) to pass through. An exemplary cleaning and coating process will be discussed afterwards with reference to FIG. 9*a* and FIG. 9*b*. An exemplary micromirror assembly of FIG. 1*a* having a micro-opening formed thereon is illustrated in FIG. 6.

Figure 6:
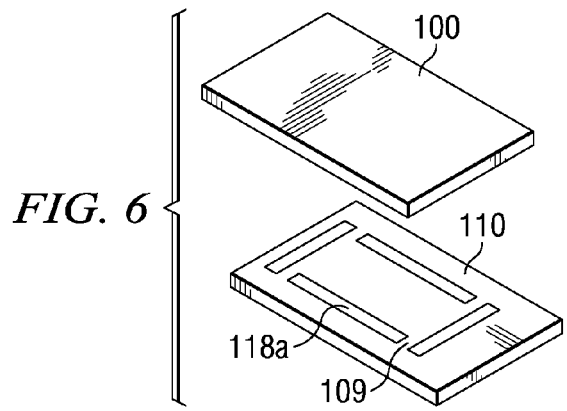
FIG. 6 illustrates an exploded perspective view of microopenings in the singulated die of FIG. 5.

In the example shown in FIG. 6, light transmissive substrate 100 having the array of deflectable and reflective mirror plates of the micromirror assembly is bonded to semiconductor substrate 110 having an array of addressing electrodes with bonding material 107. The bonding material is dispensed around the circumference of substrate 110. In this particular example, the bonding material is not a continuous line around the circumference of the device. Discontinuities in the dispensed bonding material create micro-openings, such as micro-opening 109, in the assembled device. The smaller dimension of a micro-opening is around 10 micrometers or less, or 5 micrometers or less. In other examples, the micro-openings may have a larger size, such as 10 micrometers or more. The bonding material may also be deposited on substrate 100, or on both of the substrates 100 and 110. During the bonding process, the bonding material can outgas or creep, and light organic components (e.g., solvents) will adsorb or diffuse onto the surfaces of the micromirror assembly, creating a contaminated layer. As a result of the bonding, the micromirrors formed on substrate 100 and the addressing electrodes and circuitry on substrate 110 are partly enclosed within the assembly of the substrates and the bonding material.

Before delivering the micromirror devices to customers, the micromirror devices are packaged for protection. The clean and coating processes can be performed after disposing the assembled micromirror device on a package substrate, such that the package substrate can be cleaned at the same time, as shown in a cross-sectional view in FIG. 7.

Figure 7:
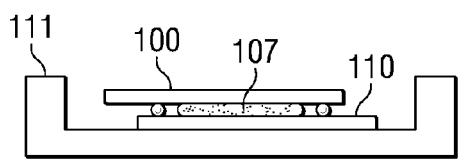
FIG. 7 illustrates a cross-sectional view of the singulated die in FIG. 6.
Figure 8:
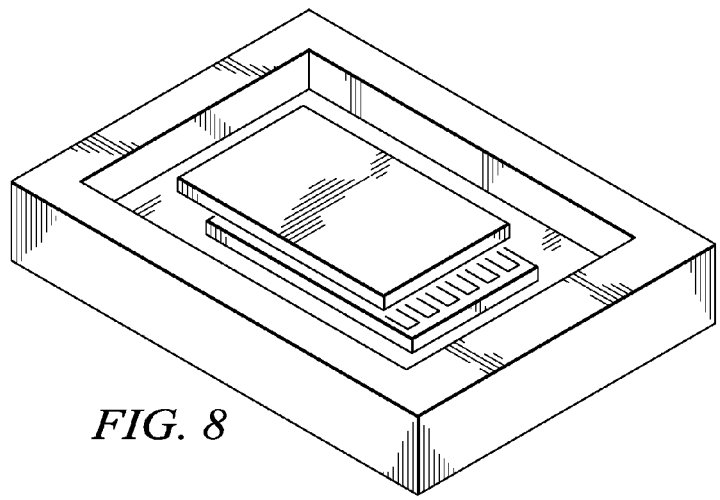
FIG. 8 illustrates the singulated die disposed in a package substrate.

Referring to FIG. 7, light transmissive substrate 100 is bonded to semiconductor substrate 110 with bonding material 107. The bonding materials form micro-openings in the gap between the bonded substrates. The semiconductor substrate is disposed on the supporting surface of package substrate 111. The package substrate in this particular example has a cavity with the supporting surface. Other examples can be found in U.S. patent application Ser. No. 10/167,361 filed Jun. 11, 2002, Ser. No. 10/443,318 filed May 12, 2003, Ser. No. 10/698,656 filed Oct. 30, 2003, and Ser. No. 10/852,981 filed May 24, 2004, the subject matter of each being incorporated herein by reference. A perspective view of the package substrate with the assembled micromirror device disposed thereon is illustrated in FIG. 8.

The assembled micromirror device is then cleaned and coated with an anti-stiction material. In the following, an exemplary releasing and post-releasing processes for the micromirror assembly discussed above with reference to FIG. 1 to FIG. 8 will be discussed. It will be understood that the following discussion is for demonstration purposes, and should not be interpreted as a limitation.

Releasing

Referring to FIG. 9*a*, the fabricated micromirror device, such as that shown in FIG. 2, is released so as to remove the sacrificial materials. This releasing process can be performed on the die level (e.g. after being singulated from the wafer) or on the wafer level (e.g. without being singulated) (step 154). The sacrificial materials can be removed by a breakthrough etch followed by a spontaneous etch using a spontaneous vapor phase etchant. The breakthrough etch removes the unwanted materials (e.g. oxidized materials, such as $SiO_x$) on the surfaces of the sacrificial materials so as to expose the sacrificial materials to the following spontaneous etch; and the spontaneous etch removes the sacrificial materials. The breakthrough etch can be a plasma etch, preferably a reactive ion etch activated by plasma. The gases used in the plasma etch can be of any suitable chemical materials, preferably having an element that when ionized reacts with the target material to be removed. For example, when the target material is a silicon containing material, such as $SiO_x$ and $SiN_x$, $CF_4$, $XeF_2$ gasses and other chemical materials can be used for the plasma etch. The spontaneous etch uses a vapor phase chemical etchant that spontaneously and chemically reacts with the sacrificial material to be removed. Exemplary such chemical agents are interhalogens, noble gas halides, HF, and other suitable materials.

Vapor phase $XeF_2$ can be used in both of the breakthrough etch and spontaneous etch. In the breakthrough etch, $XeF_2$ gas is decomposed and ionized in the plasma. The fluoride ion stream is directed to the silicon-containing target material to be removed (e.g. $SiO_x$ material) and chemically reacts with the Si of the Si containing target material so as to remove the silicon containing target material. When the silicon-containing and/or oxidized materials that cover the sacrificial materials are substantially stripped off the surface the sacrificial materials, the breakthrough etch is stopped and the spontaneous etching is activated.

The breakthrough etch and spontaneous etch can be performed in separate etching systems (or etching chambers), and can alternatively be performed in the same etching system, preferably in the same etching chamber, as set forth in U.S. patent application Ser. No. 10/665,998, Ser. No. 10/666,671, and Ser. No. 10/666,002, all filed Sep. 17, 2003, the subject matter of each being incorporated herein by reference.

When the sacrificial materials are substantially removed, the etching process is stopped. The micromirror is removed from the etch chamber for further processes. For example, the released micromirror can be baked in an oven at a temperature around 120° C. for 1.5 hours in air or inert gas (e.g. nitrogen) followed by another baking process at 350° C. for 3 hours in nitrogen or other inert gas.

After baking, the micromirror can be assembled with the addressing electrode array in an assembly house. After assembly, the substrate (e.g. substrate 100 in FIG. 1b) having the mirror plates is bonded to semiconductor substrate 110 having the addressing electrodes. An exemplary assembly is shown in FIG. 5 to FIG. 8. The assembly may have other features, such as a compliant die-attach as that set forth in U.S. patent application Ser. No. 11/100,104 filed Apr. 5, 2005; a substrate insert as that set forth in U.S. patent application Ser. No. 10/698,656 filed Oct. 30, 2003; and an electrical contact of the mirror plates as that set forth in U.S. patent application Ser. No. 11/102,082 filed Apr. 8, 2005 can be provided, the subject matter of each above US patent applications is incorporated herein by reference. It is noted that the assembly can be performed on the wafer level as discussed above with reference to FIG. 4a and FIG. 4b, or can be on the die level. When the assembly is performed on the wafer level, the assembly is singulated as discussed above with reference to FIG. 5.

Post-Release Processes

After the assembly, the micromirror assembly is pre-cleaned at step 156. The pre-cleaning can be performed in a clean-room with cotton swabs dipped in acetone to remove particles from the optical surface (e.g. the surface of the light transmissive substrate of the micromirror assembly) followed by inspection of the visible deflects under microscope. The inspection information can be logged into a database.

Following the pre-cleaning, an anti-stiction treatment can be applied to the cleaned micromirror device so as to prevent potential in-site stiction of the micromirror device (step 158). The anti-stiction treatment may comprise an ozone cleaning followed by a self-atomic-monolayer (SAM) coating, as set forth in U.S. patent application Ser. No. 10/713,671 filed Nov. 13, 2003, the subject matter being incorporated herein by reference.

Ozone Cleaning and Sam Coating

In an exemplary cleaning process, a cleaning agent, such as a gas mixture containing ozone, is applied to the surface to remove contaminants, such as organic residues on the surface. The cleaning agent may comprise humid ozone gas and dry ozone gas. "Humid ozone gas" is a mixture of water vapor and ozone gas. "Dry ozone gas" is ozone gas without significant amounts of water vapor. In the coating process, one or more vapor phase agents are introduced to the surface of the microstructure. The coating agents react with the surface to form a chemically bonded surface layer.

Figure 10:
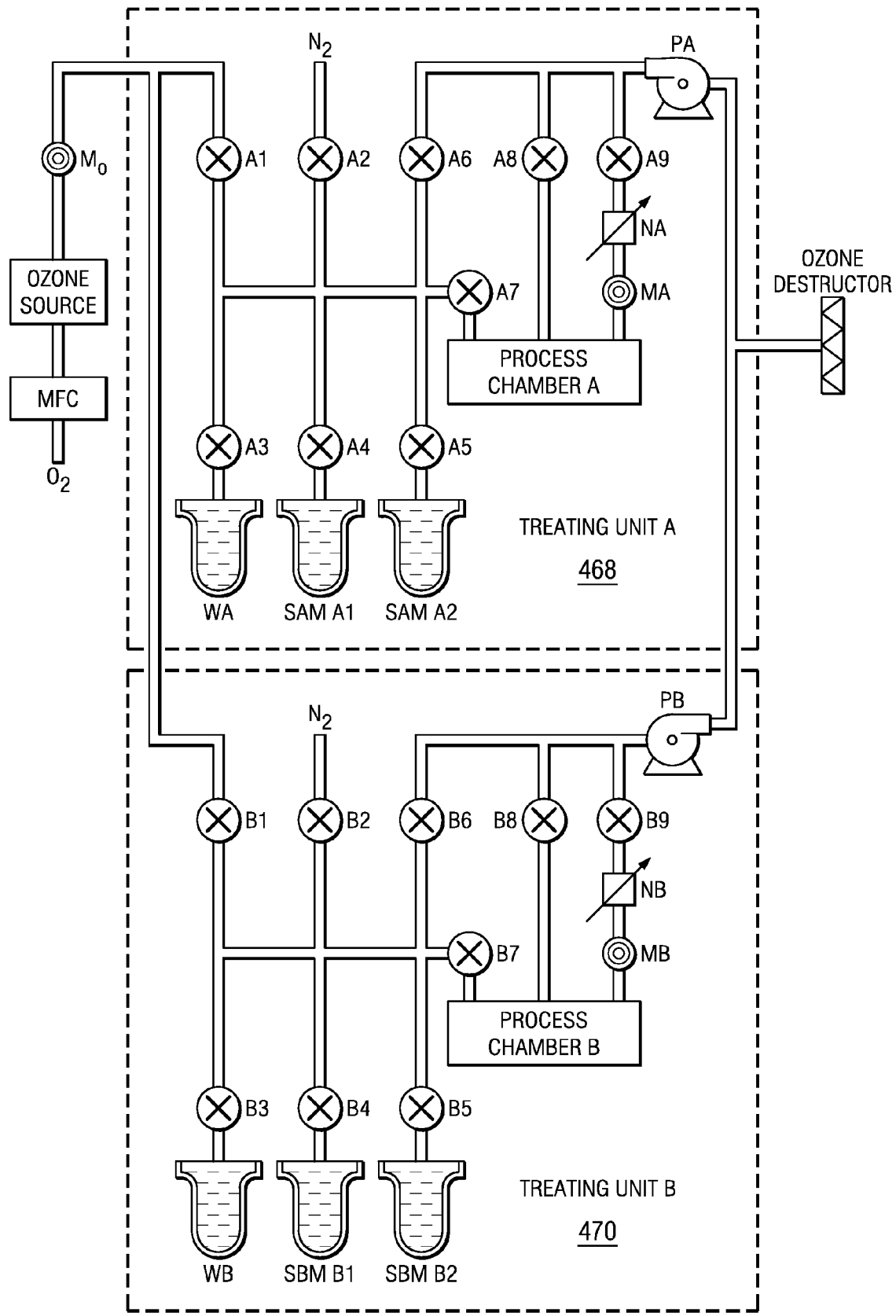
FIG. 10 illustrates an exemplary $O_3$/SAM treating processing system.

As a way of example, FIG. 9b shows the steps executed for performing exemplary ozone cleaning and self-assembly-monolayer (SAM) coating processes. The ozone and SAM coating processes can be performed in a processing system as shown in FIG. 10. Referring to FIG. 10, the process system comprises processing chamber A and processing chamber B, in each of which the micromirror assembly is disposed; and the ozone and SAM coating processes are performed. Each processing chamber is connected to an ozone source that generates gaseous ozone. For example, processing chamber A is connected to the ozone source through valves, such as pneumatic valves $A_1$ and $A_7$; and processing chamber B is connected to the ozone source through pneumatic valves $B_1$ and $B_7$. Connected to the ozone generator is a mass-flow-controller (MFC) for regulating the flow rate of oxygen gas. Each processing chamber is connected to the set of SAM coating sources. Specifically, processing chamber A is connected to SAM $A_1$ and SAM $A_2$ sources respectively via pneumatic valves $A_4$, $A_5$, and $A_7$. Each SAM $A_1$ and SAM $A_2$ contains a self-assembly mono-layer coating precursor. Similarly, processing chamber B has SAM $B_1$ and SAM $B_2$ sources connected there to via pneumatic valves $B_4$, $B_5$, and $B_7$. The cleaning and SAM processes can alternatively be performed in the presence of diluent gases, preferably an inert gas, such as helium and nitrogen. The diluent gases are introduced into the processing chamber through pneumatic valves $A_2$ for chamber A, and $B_2$ for chamber B.

The residues, by-products, and remaining gases in the processing chambers are released through pneumatic valves $A_8$ for chamber A and $B_8$ for chamber B. For monitoring the processing status in the processing chambers, ozone monitors $M_a$ and $M_b$ are provided, and connected respectively to chambers A and B. In association with the ozone monitors, needle vales $N_a$ and $N_b$ and pneumatic valves $A_9$ and $B_9$ are used along with the monitors for regulating the gas flow. Pumps $P_a$ and $P_b$ are respectively connected to processing chambers A and B for pumping out the processing chambers. Due to the hazardous and toxic nature of ozone, the ozone destructor is connected downstream of the pumps before releasing the ozone from the processing system.

In the above example, two processing chambers A and B are provided, and are arranged in parallel—that is, the cleaning and SAM agents can be simultaneously introduced into the processing chambers, and each chamber can be operated independently. Alternatively, any desired number of processing chambers as chambers A and B can be enclosed in the system.

As seen in the example, each chamber is provided with a set of ozone precursors, as well as the vapor water source. This configuration, even though increasing the number of sources, enables precise control of the cleaning and coating processes. The cleaning and coating processes, as will be detailed afterwards, are preferably performed within certain temperature and pressure ranges. If the cubical volume of the SAM containers is too large, the temperature and pressure would not be easily controlled.

In the above example, water containers $W_a$ and $W_b$ are provided and respectively connected to the chambers A and B for providing vapor water. In an alternative example wherein vapor water is not necessary for cleaning or coating, the water containers can be removed, or disconnected throughout the cleaning and SAM treatment.

Figure 11:
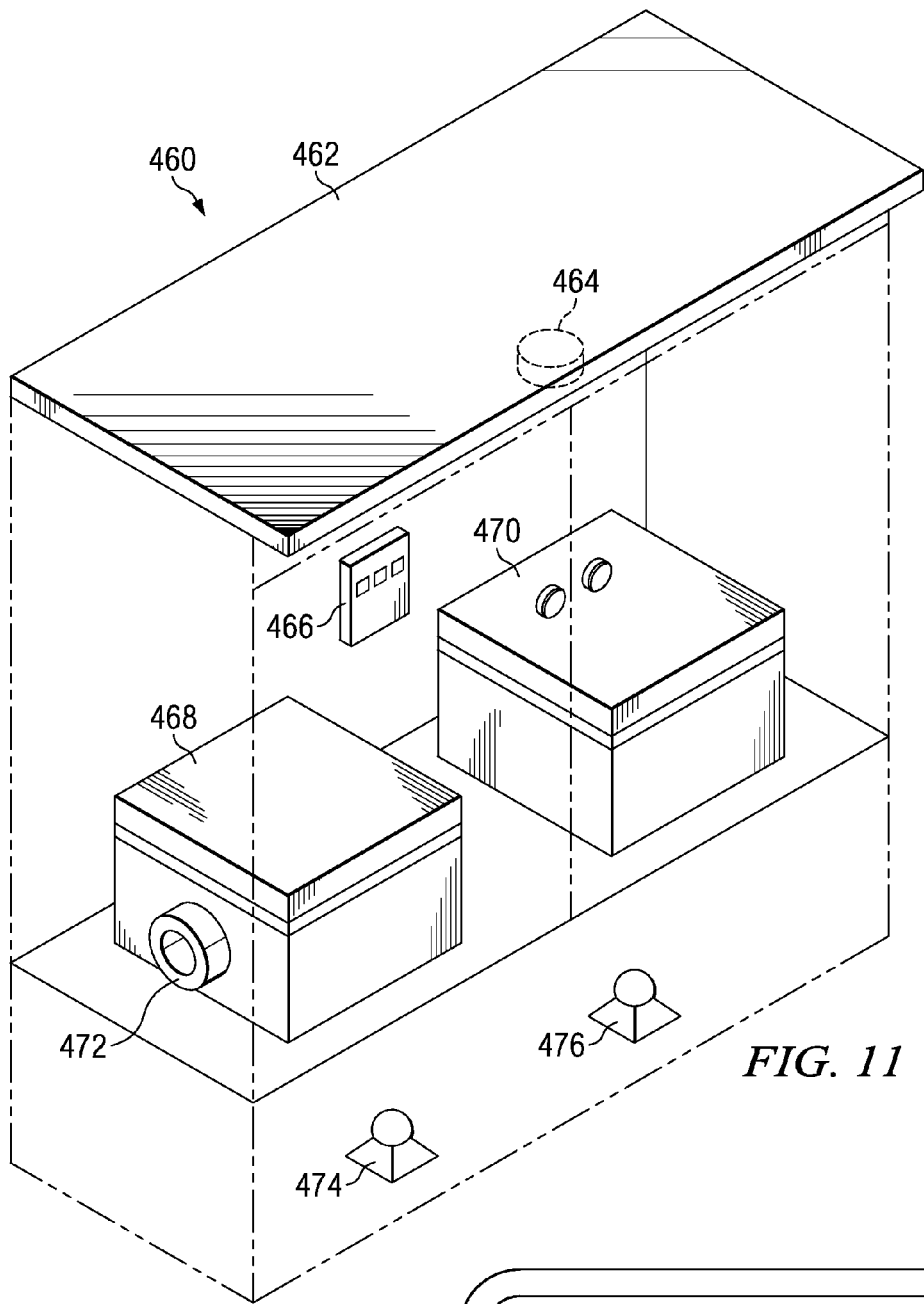
FIG. 11 illustrates an outfit of the system in FIG. 10.

The processing system as shown in FIG. 10 can be enclosed within a cabinet such that hazardous and toxic gases and by-products are prevented from leaking into the environment causing damages to the operators. An exemplary cabinet is illustrated in FIG. 11. Referring to FIG. 11, cabinet 460 comprises an upper space and a lower space separated by the clapboard. In the upper space, ceiling plate 462, front doors each with a knob, side walls, and the clapboard together enclose the processing chambers 468 and 470 within the upper space. The containers and other gases and/or vapor sources, such as vapor water contains (e.g. $W_A$ and $W_B$ in FIG. 10), monolayer precursors (e.g. SAM $A_1$ and SAM $A_2$ in FIG. 10), as well as valves (e.g. the pneumatic and needle vales) can also be disposed within the cabinet. The ozone source is preferably disposed outside the cabinet due to its big size.

For dynamically monitoring and/or regulating the flow the ozone and other gases flowing inside the processing chambers, each chamber is installed with a pressure gauge, such as gauge 472. Alternatively, multiple gauges can be attached to each processing chamber for being operated in different ranges.

Because the ozone gas is hazardous and toxic, ozone detector 466 can be disposed within the cabinet such that an alarm can alert the operators when the ozone leaking occurs. As an alternative feature, door-open detector 464 is provided for monitoring the status of the front doors. Specifically, when either one of the front door is opened, the door-open detector activates to give an alarm. The door-open detector can alternatively be connected to the ozone valves, preferably regulating the ozone gas flowing into the chambers, such that the ozone valves can shut off the ozone, or reduce the ozone flow rate when the door-open detector is activated.

In the lower space, pumps (e.g. pumps 474 and 476), electrical circuits and control boards, switches, and other components used for electrically controlling the processing chambers and gases flows, detectors, regulators, monitors, data inputs and outputs, can be disposed therein; and communicate with the corresponding components in the upper space.

With the processing system as discussed above with reference to FIG. 10 and FIG. 11, the released micromirror devices are cleaned and treated with anti-stiction. Referring back to FIG. 9b, steps executed in an exemplary cleaning and SAM treatment are illustrated therein. The process starts from checking the processing system status (step 452). In particular, the precursor levels in the SAM precursor containers (e.g. $W_A$ and $W_B$ in FIG. 10), monolayer precursors (e.g. SAM $A_1$ and SAM $A_2$ in FIG. 10) are examined. The oxygen gas input into the ozone source for generating ozone gas is examined. For example, the pressure of the input oxygen can be from 20-50 psi. The oxygen cylinder containing the oxygen can be 500 psi or larger. Otherwise, a new oxygen source should be used.

After system check at step 452, pre $O_3$ cleaning is performed at step 454. The pre-cleaning can be performed in a clean-room with cotton swabs dipped in acetone to remove particles from the optical surface (e.g. the surface of the light transmissive substrate of the micromirror assembly) followed by inspection of the visible deflects under microscope. The inspection information can be logged into a database.

Following the pre-cleaning, an anti-stiction treatment can be applied to the cleaned micromirror device so as to prevent potential in-site stiction of the micromirror device. The anti-stiction treatment may comprise an ozone cleaning followed by a self-atomic-monolayer (SAM) coating, as set forth in U.S. patent application Ser. No. 10/713,671 filed Nov. 13, 2003, the subject matter being incorporated herein by reference.

Figure 12:
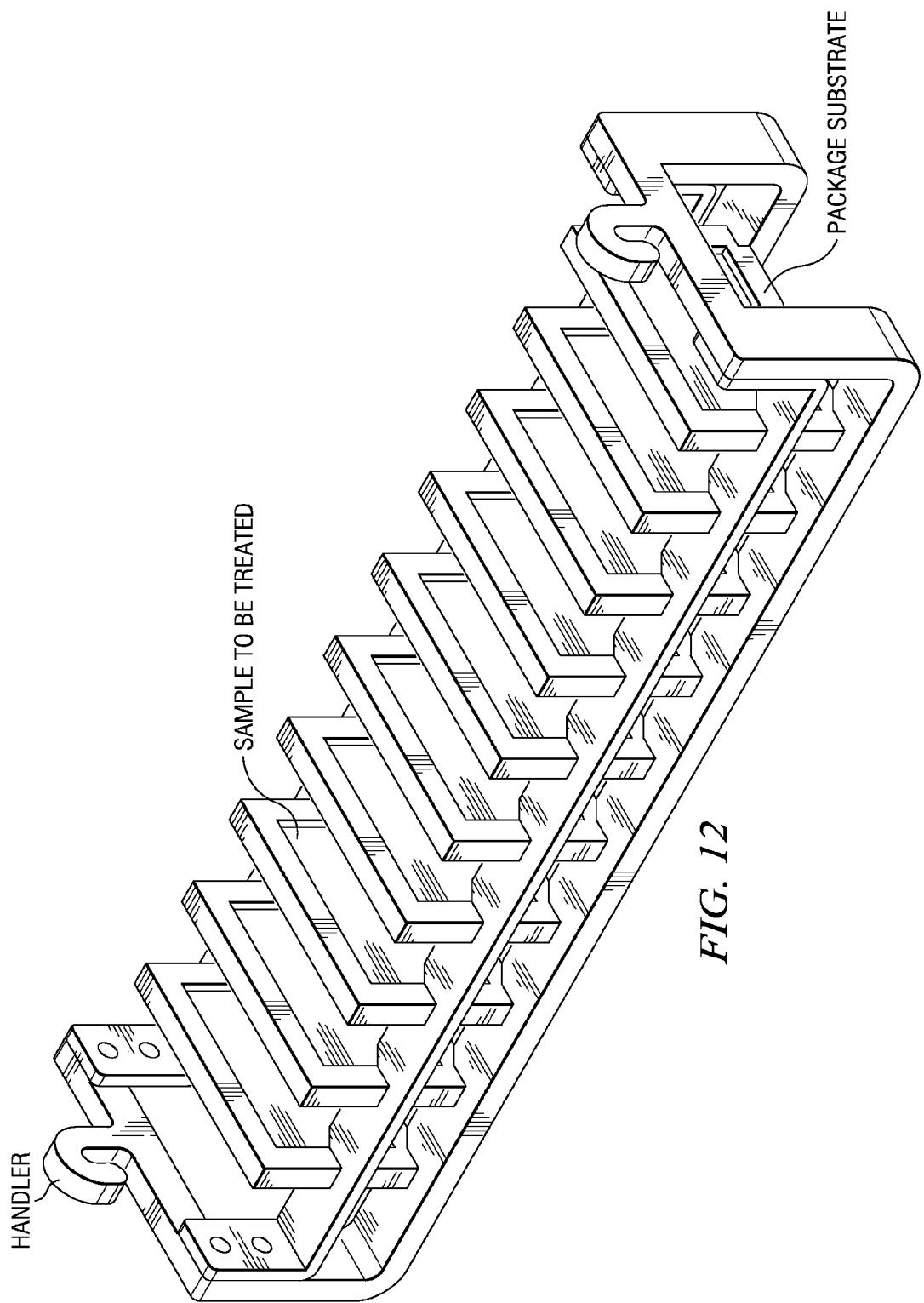
FIG. 12 illustrates an exemplary tray for use in the processing system.

For cleaning with ozone gas and treating with SAM materials, the released micromirror devices in packages are loaded into the processing chambers. In this particular example, the released micromirror devices in packages are placed in a sample tray as shown in FIG. 12. The sample tray comprises a plurality of sample slots for holding the released micromirror devices. Each slot is formed by lower support layers and upper holding layers. The tray comprises a handler with a hook for simplifying the transit. The released micromirror devices in packages are preferably loaded into the tray facing in the same direction, as shown in the figure. Before loading the released micromirror devices in packages into the tray, the tray is preferably cleaned.

Figure 13:
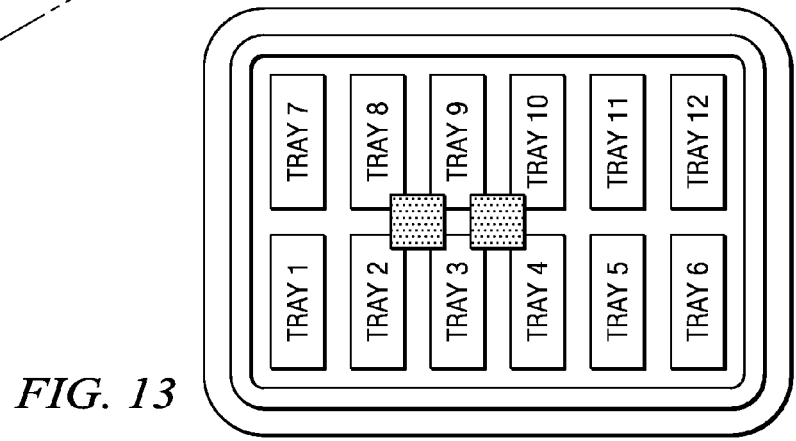
FIG. 13 is a top view of an exemplary tray-carrier for use in the processing system.

Referring back to FIG. 9b, the tray loaded with the released micromirror devices in packages can be loaded into a tray-carrier, such as that shown in FIG. 13. Referring to FIG. 13, the tray-carrier comprises a plurality of tray areas, such as areas 1 to 12. Each tray area is designated for accommodating a tray loaded with the released micromirror devices in packages, as that shown in FIG. 12. Of course, the tray-carrier in FIG. 13 may comprise any desired number of tray areas.

Referring back to FIG. 9b, the tray-carriers loaded with the trays are then disposed into the processing chambers, such as the processing chambers 468 and 470 in FIG. 10 and FIG. 11. The tray carriers in the processing chambers are latched inside the processing chambers. When multiple tray-carriers are disposed in a single processing chamber, the tray-carriers may or may not be arranged such that the released-micromirror devices in packages are facing the same direction.

With the packaged released micromirror devices loaded in the processing chambers, the trays, and the tray-carriers are recorded by their identification numbers (step 460 in FIG. 9b). The identification numbers can be assigned automatically by a computing device in control of the processing system, or alternatively, by the operator.

After recording the information, the ozone cleaning and SAM treatment processes are executed. Example ozone cleaning and SAM treatment processes are illustrated in FIG. 9c. Referring to FIG. 9C, the processing chambers loaded with the released micromirror devices in packages are pumped out (step 468) followed by filling the chambers with vapor ozone and oxygen (step 470). The temperature inside the processing chambers is preferably 160° C., and the partial pressure of the ozone/oxygen gas is around 1000 Torr or less, such as 560 Torr, more preferably from 560 Torr to 600 Torr. In addition to ozone and oxygen, vapor water, or ozone and oxygen saturated with the vapor water can be used. After a predetermined time period (step 474) for cleaning the released micromirror devices in packages, such as 1 minute or more, the ozone and oxygen (and vapor water if used) are then pumped out (step 476). The steps from filling the processing chambers with the ozone, and oxygen to the step of pumping them out the treatment chamber can be repeated many times, preferably 10 times or more, 40 times or more, or 80 times or more to guarantee that the released micromirror devices in packages are completely cleaned. Repeating of the above steps is controlled at step 478.

After the released micromirror devices in packages are cleaned; and oxygen and ozone gases are pumped out from the processing chambers, one or more self-atomic monolayer (SAM) precursors are introduced into the each processing chamber for coating the released micromirror devices in packages (step 480). The SAM precursors are preferably introduced with a partial pressure around 5 Torr or less. The processing chambers are then isolated by closing the valves, and waiting for a time period, such as 10 to 30 minutes, or 15 to 20 minutes, as set forth in U.S. patent application Ser. No. 10/713,671 filed Nov. 13, 2003, the subject matter being incorporated herein by reference.

In an alternative example, after filling the processing chambers with the SAM precursors and waiting for a predetermined time, the processing chambers are pumped out to remove the SAM precursor followed by filling the treatment chamber with water vapor, preferably with a partial pressure from 10 to 15 Torr. The processing chambers are then isolated by closing the valves so as to allow the surfaces, for example the contacting surfaces of the released micromirror devices in packaged, to be treated with the SAM material. To guarantee that the SAM material is reliably formed on the surfaces of the micromirror devices, the steps of filling the SAM precursor to the step of holding the processing chambers for a time period can be repeated for several times, such as two times or more, or three times or more, or four times or more. Before each repeat, the processing chamber can be pumped out to remove the residue chemicals previously filled in the treatment chamber.

In cleaning and/or SAM coating, diluent gases can be used. The diluent gas is preferably inert gases, such as helium, nitrogen, and argon.

The processing chambers are then purged with an inert gas, such as nitrogen. This process may comprise a repeat of a step of pumping out the processing chambers for 59 seconds followed by a step of filing the processing chambers with nitrogen for 1 second. After the purging the processing chambers, the processing chambers can be cooled down to a temperature of 60° C. or less. The micromirror devices in packages are then removed from the processing chambers.

After being treated with the SAM material, the micromirror devices in packages may be treated with a lubricant (step 160 and step 162). In accordance with an embodiment of the invention, the lubricant is applied to the micromirror device with a capillary tubing, as set forth in U.S. patent application Ser. No. 10/811,449 filed Mar. 26, 2004, the subject matter being incorporated herein by reference. Referring again to FIG. 6, the micromirror device after the SAM treatment is stored in a vacuum sealed container (step 160). A lubricant is prepared (step 162). The lubricant material can be pre-mixed, preferably containing FC-70 and FC-77 (the fluorinert electronic liquids from 3M)$_s$ with a ratio of 1:4. The pre-mixed lubricant is transferred in a syringe into a sealer glovebox. A silicon capillary tube preferably with a diameter of 100 microns and length of 26 mm is wiped with acetone and IPA. Before the use, the capillary tubing can be baked in a Petri dish at 120° C. for 30 minutes or more. The capillary tubing is then transferred in a Petri dish to the glovebox.

The capillary tubing for the lubricant is preferably disposed on a package substrate used for packaging the micromirror device. In accordance with an embodiment of the invention, the micromirror device is disposed within a space between a package substrate and package cover. The package substrate may have a cavity with a supporting surface on which the micromirror device is disposed. The package cover can then be bonded to the package substrate so as to seal (either hermetically or non-hermetically) the micromirror device within the cavity. For facilitating the bonding (e.g. the hermetic sealing) of the package cover to the package substrate so as to sealing seal the micromirror device, the packaging substrate preferably has a build in built-in heater that is embedded in the layers of the packaging substrate, as set forth in U.S. patent application Ser. No. 10/443,318 filed May 24, 2003, the subject matter being incorporated herein by reference.

Before packaging the micromirror device and disposing the capillary tubing in the packaging substrate, the package substrate and package cover are preferably cleaned (step 164).

The package cover can be cleaned with an ozone/UV cleaning, preferably in a SAMCO tool. Each side of the package cover can be cleaned at 120° C. for 20 minutes. The top side of the package cover (i.e. the side that will be exposed to the operation environment) can be further cleaned with acetone followed by ozone/UV cleaning at 120° C. for 5 minutes. The cleaned package cover can be kept in an IPA-cleaned and dry nitrogen blow-off box and transferred to the glovebox.

In packaging the micromirror device, other alternative features may be applied. For example, a substrate insert, such as a silicon strip can be disposed between the bottom substrate (e.g. the semiconductor substrate 110 in FIG. 1*b*) and package substrate for reducing and dissipating unwanted stresses in the substrates of the micromirror device, as set forth in U.S. patent application Ser. No. 10/698,656 filed Oct. 30, 2003, the subject matter being incorporated herein by reference. Before disposing the substrate insert on the package, the substrate insert is cleaned (step 166 of FIG. 6). For example, the silicon substrate insert can be cleaned by rinsing with acetone for 30 seconds. The substrate insert can be further cleaned with IPA. The substrate insert after acetone and IPA cleaning can be baked at 120° C. for 30 minutes or more in a covered Petri dish.

In addition to the lubricant and substrate insert, a getter material (preferably two trips of getter in each micromirror device package) can also be disposed in the packaged device to absorb moistures and other contaminant particles in the package (step 166). The getter can be HICAP 2100 and kept in a nitrogen environment, and dispensed using a standard tool on the unpolished side of each getter strip. The getter is then covered and baked in a nitrogen hot plate at 70° C. for 20 to 30 minutes, followed by baking at 350° C. for 15 minutes. The baking temperature is ramped down to 70° C. The prepared getter after baking can be placed in a clean jar and transferred to the glovebox.

When the capillary tubing, lubricant, getter, substrate insert, package cover, and package substrate are prepared and transferred into the glovebox, the micromirror device is packaged (step 168 in FIG. 9*a*). For packaging the micromirror device, a frame is placed on the rim (e.g. gold rim) of the package substrate. The micromirror device is attached to the package substrate with one or more pieces of substrate insert disposed therebetween. The prepared capillary tubing is dipped into the lubricant solution for 20 seconds. Preferably, two 26 mm long capillary tubes are placed in the package, for example, on the package substrate. The getter and other desired elements can also be placed on the package substrate, but preferably before placing the capillary tubing. The package cover is placed on the package substrate as quick as possible to minimize loss of the highly volatile lubricant.

For bonding the packaging substrate and packaging substrate, the package cover is mechanically pressed to the packaging substrate followed by a hermetic sealing. The hermetic sealing is performed by applying an electrical current to the built-in heater in the packaging substrate so as to heat the bonding area at the package substrate and packaging cover to a temperature high enough (e.g. 230° C.) for melting the bonding agent in the bonding area, as set forth in U.S. patent application Ser. No. 10/698,656 filed Oct. 30, 2003. During the bonding process with heating, the bottom of the packaging substrate is preferably cooled (e.g. to a temperature around 40° C.) with a cold sink so as to localize the heat.

The sealed micromirror device package can be inspected, for example, through a leaking test (step 170 in FIG. 9a) using helium gas. Additional leaking test, such as a gross leak-test with fluorocarbon liquid can be carried out.

After leak-test, the micromirror device packages passing the leak-test are baked so as to dispense the lubricant that is enclosed within the package (step 172 in FIG. 9a). The baking can be performed by baking the micromirror device package at 120° C. for approximately 30 minutes.

The micromirror device after baking can be inspected for its quality and performance. The inspection may comprise visual inspection of the defects, uniformity test using optical methods for testing the uniformity of the mirror plates as set forth in U.S. patent application Ser. No. 10/875,602 filed Jun. 23, 2004; U.S. patent application Ser. No. 10/875,555 filed Jun. 23, 2004; U.S. patent application Ser. No. 10/875,760 filed Jun. 23, 2004, and U.S. patent application Ser. No. 11/109,994 filed Apr. 19, 2005, the subject matter of each being incorporated herein by reference.

The above discussed release and post-release treatments each can be performed on the wafer level or die level. Specifically, the ozone cleaning can be performed on the wafer level or on die level. In applying the SAM material, a catalyst coating (e.g. (OH)4P coating) can be performed, preferably before applying the SAM material so as to increase the density of OH groups on the treated surface of the micromirror device, especially for the surface containing titanium.

Figure 14:
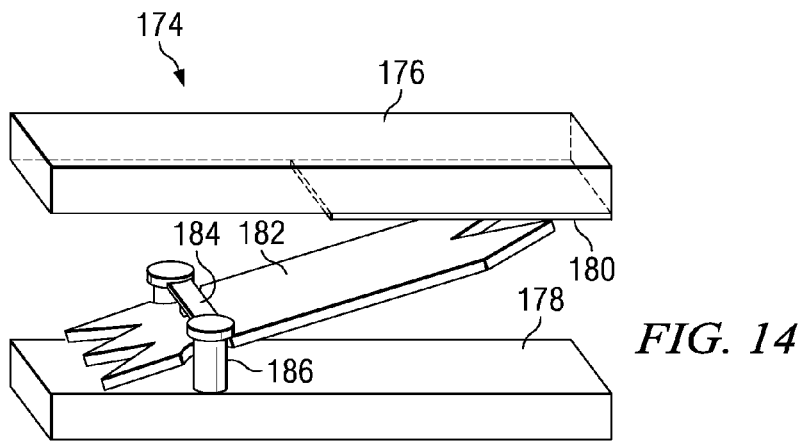
FIG. 14 is a perspective view of an exemplary micromirror device fabricated by the invention.

The methods as discussed above are applicable to many different microelectromechanical devices, such as varieties of different micromirrors. As a way of example, FIG. 14 illustrates a perspective view of an exemplary micromirror device in which embodiments of the invention can be implemented. Micromirror device 174 comprises substrate 178 that is a light transmissive substrate such as glass, quartz, and sapphire and semiconductor substrate 176, such as silicon substrate. Deflectable and reflective mirror plate 182 is spaced apart and attached to deformable hinge 184 via a hinge contact. The deformable hinge is affixed to and held by posts 186. The semiconductor substrate has addressing electrode 180 for deflecting the mirror plate.

Figure 15:
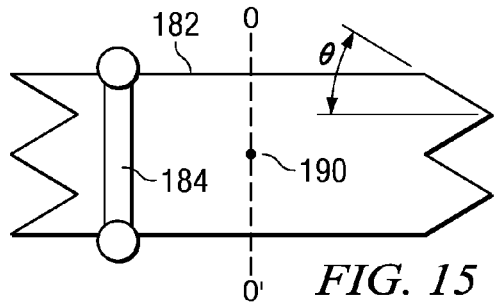
FIG. 15 is a top view of the micromirror in FIG. 14.

A top view of the micromirror in FIG. 14 is illustrated in FIG. 15. As can be seen in FIG. 15, deformable hinge 184 is not along but offset from the symmetrical axis OO' of the mirror plate such that the mirror plate is operable to rotate asymmetrically. The deformable hinge is located beneath the mirror plate in the direction of the incident light. That is, the mirror plate is located between the light transmissive substrate and the deformable hinge such that the deformable hinge is not illuminated by the incident light so as to prevent unexpected light scattering from the deformable hinge, thereby, increasing the contrast ratio of the produced image. The quality of the produced image is further improved through reduction of the light scattering from the edges of the mirror plate by forming the edges of the mirror plate into a zigzag shape, as shown in the figure.

The deflectable and reflective mirror plate can be a multilayered structure. For example, the mirror plate may comprise an electrical conducting layer, a reflective layer that is capable of reflecting 85% or more, or 90% or more, or 85% or more, or 99% or more of the incident light (e.g. incident visible light), a mechanical enhancing layer that enhances the mechanical properties of the mirror plate. An exemplary mirror plate can be a multilayered structure comprising a $SiO_2$ layer, an aluminum layer, a titanium layer, and a titanium nitride layer. When aluminum is used for the mirror plate; and amorphous silicon is used as the sacrificial material, diffusion between the aluminum layer and the sacrificial material may occur. This can be avoided by depositing a barrier layer therebetween.

Figure 16:
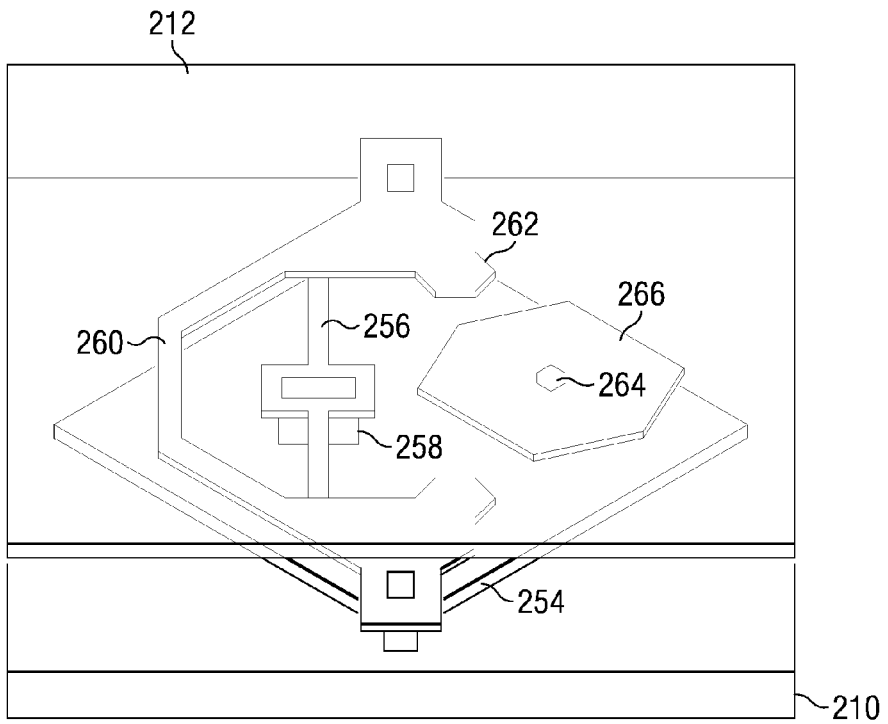
FIG. 16 is a perspective view of another exemplary micromirror device fabricated by the invention.

Another exemplary micromirror device is illustrated in its perspective view in FIG. 16. Referring to FIG. 16, deflectable reflective mirror plate 254 with a substantially square shape is formed on light transmissive substrate 210, and is attached to deformable hinge 256 via hinge contact 258. The deformable hinge is held by hinge support 260, and the hinge support is affixed and held by posts on the light transmissive substrate. For electrostatically deflecting the mirror plate, an addressing electrode (not shown in the figure for simplicity purposes) is fabricated in the semiconductor substrate 212. For improving the electrical coupling of the deflectable mirror plate to the electrostatic field, extending metallic plate 266 can be formed on the mirror plate and contacted to the mirror plate via post 264. Light blocking pad 268 is disposed between the surface of the post and substrate 210 so as to reduce unexpected light scattering from the post. The light blocking pad can also be deployed in a way so as to block light scattered from other portions of the micromirror, such as the tips (or the corners) of the mirror plate of the micromirror, and the exterior surfaces (e.g. the walls) of the posts.

Similar to that shown in FIG. 14, the deformable hinge is preferably formed beneath the deflectable mirror plate in the direction of the incident light so as to avoid unexpected light scattering by the deformable hinge. For reducing unexpected light scattering of the mirror plate edge, the illumination light is preferably incident onto the mirror plate along a corner of the mirror plate.

Figure 17:
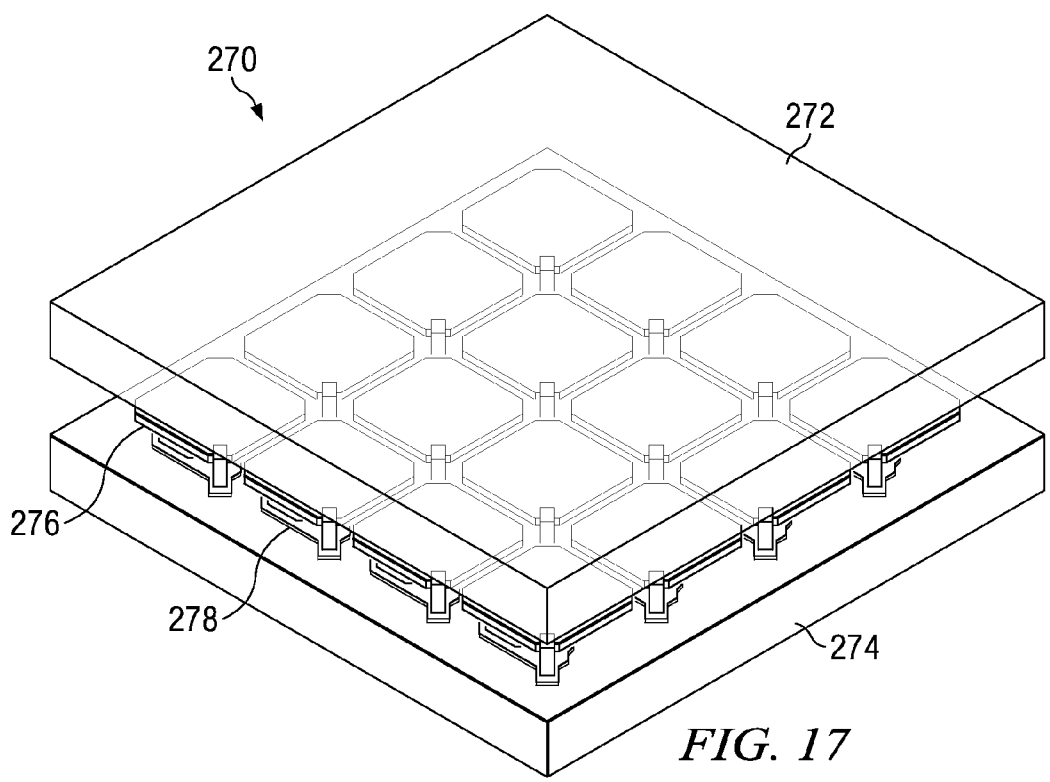
FIG. 17 is a perspective view of a spatial light modulator comprising an array of micromirror devices fabricated by the invention.

Referring to FIG. 17, an exemplary spatial light modulator having an array of micromirrors of FIG. 16 is illustrated therein. For simplicity purposes, only 4×4 micromirrors are presented. In general, the micromirror array of a spatial light modulator consists of thousands or millions of micromirrors, the total number of which determines the resolution of the displayed images. For example, the micromirror array of the spatial light modulator may have 1024×768 or more, 1280× 720 or more, 1400×1050 or more, 1600×1200 or more, 1920× 1080 or more, or even larger number of micromirrors. In other applications, the micromirror array may have less number of micromirrors.

In this example, the array of deflectable reflective mirror plates 276 is disposed between light transmissive substrate 272 and semiconductor substrate 274 having formed thereon an array of addressing electrodes 278 each of which is associated with a mirror plate for electrostatically deflecting the mirror plate. The posts of the micromirrors are covered by light blocking pads 280 for reducing expected light scattering from the surfaces of the posts.

In operation, the illumination light passes through the light transmissive substrate and illuminates the reflective surfaces of the mirror plates, from which the illumination light is modulated. The illumination light incident onto the areas corresponding to the surfaces of the posts is blocked (e.g. reflected or absorbed depending upon the materials of the light blocking pads) by the light blocking pads. The reflected illumination light from the mirror plates at the ON state is collected by a projection lens so as to generate a "bright" pixel in the display target. The reflected illumination from the mirror plates at the OFF state travels away from the projection lens, resulting in the corresponding pixels imaged at the display target being "dark."

The micromirrors in the array can be arranged in many suitable ways. For example, the micromirrors can be arranged such that the center-to-center distance between the adjacent mirror plates can be 10.16 microns or less, such as 4.38 to 10.16 microns. The nearest distance between the edges of the mirror plate can be from 0.1 to 1.5 microns, such as from 0.15 to 0.45 micron, as set forth in U.S. patent application Ser. No. 10/627,302, Ser. No. 10/627,155, and Ser. No. 10/627,303, both to Patel, filed Jul. 24, 2003, the subject matter of each being incorporated herein by reference.

Figure 18:
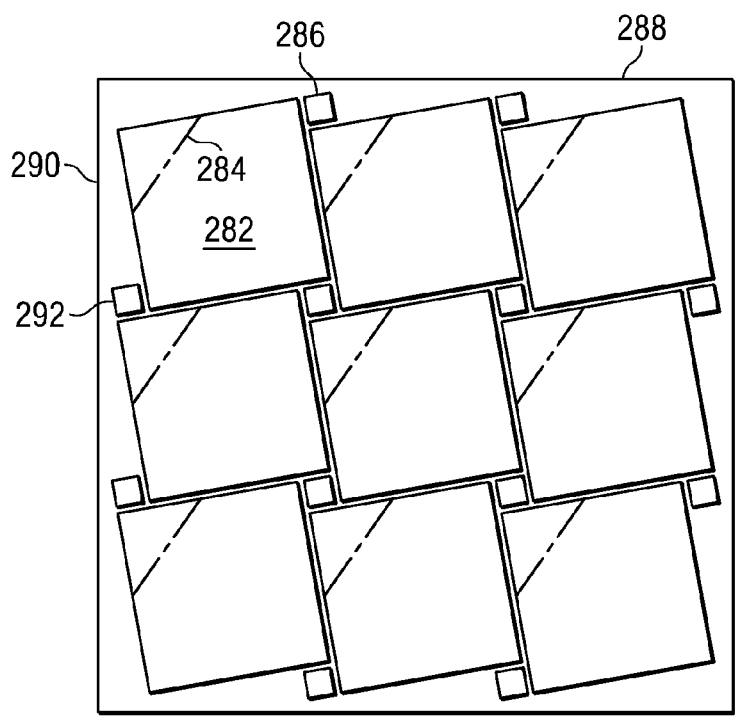
FIG. 18 is a top view of another spatial light modulator comprising an array of micromirror devices fabricated by the invention.

The micromirrors in the micromirror array of the spatial light modulator can be arranged in alternative ways, another one of which is illustrated in FIG. 18. Referring to FIG. 18, each micromirror is rotated around its geometric center by an angle less than 45° degrees. The posts (e.g. 286 and 292) of each micromirror (e.g. mirror 282) are then aligned to the opposite edges of the mirror plate. No edges of the mirror plate are parallel to an edge (e.g. edges 288 or 290) of the micromirror array. The rotation axis (e.g. axis 284) of each mirror plate is parallel to but offset from a diagonal of the mirror plate when viewed from the top of the mirror plate at a non-deflected state.

Figure 19:
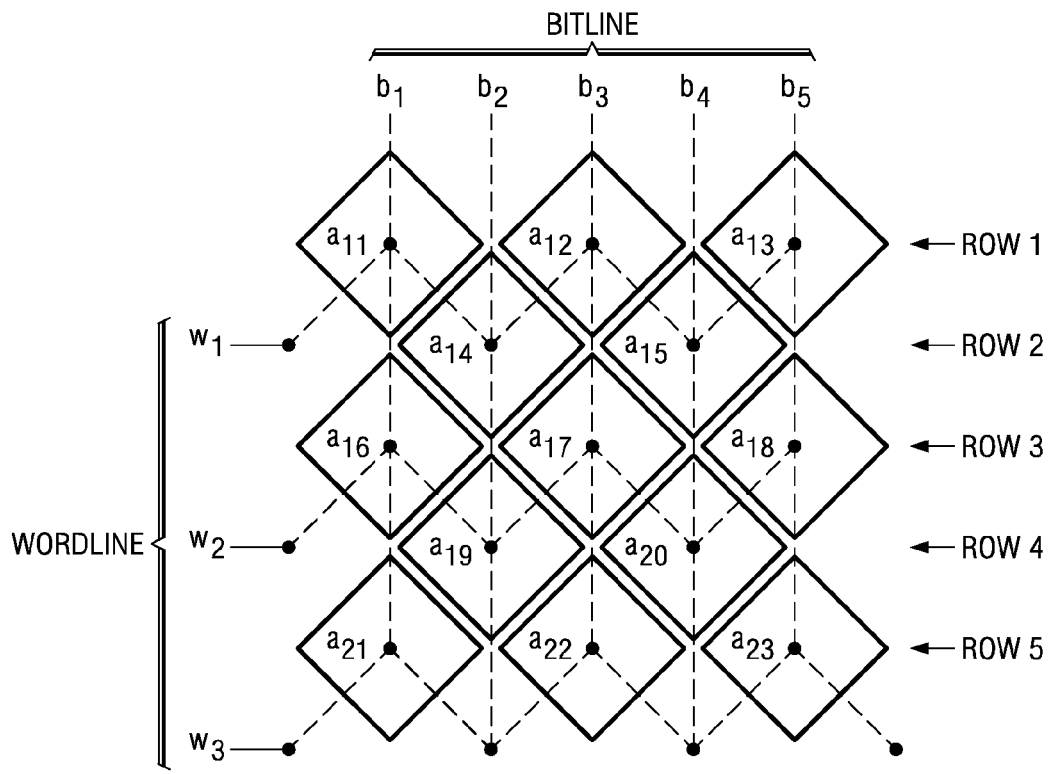
FIG. 19 is a perspective view of yet another spatial light modulator comprising an array of micromirror devices fabricated by the invention.

FIG. 19 illustrates the top view of another micromirror array having an array of micromirrors of FIG. 16. In this example, each micromirror is rotated 45° degrees around its geometric center. For addressing the micromirrors, the bitlines and wordlines are deployed in a way such that each column of the array is connected to a bitline but each wordline alternatively connects micromirrors of adjacent rows. For example, bitlines $b_1$, $b_2$, $b_3$, $b_4$, and $b_5$ respectively connect micromirrors groups ($a_{11}$, $a_{16}$, and $a_{21}$), ($a_{14}$ and $a_{19}$), ($a_{12}$, $a_{17}$, and $a_{22}$), ($a_{15}$ and $a_{20}$), and ($a_{13}$, $a_{18}$, and $a_{23}$). Wordlines $w_1$, $w_2$, and $w_3$ respectively connect micromirror groups ($a_{11}$, $a_{14}$, $a_{12}$, $a_{15}$, and $a_{13}$), ($a_{16}$, $a_{19}$, $a_{17}$, $a_{20}$, and $a_{18}$), and ($a_{21}$, $a_{22}$, and $a_{23}$). With this configuration, the total number of wordlines is less than the total number of bitlines.

Figure 20:
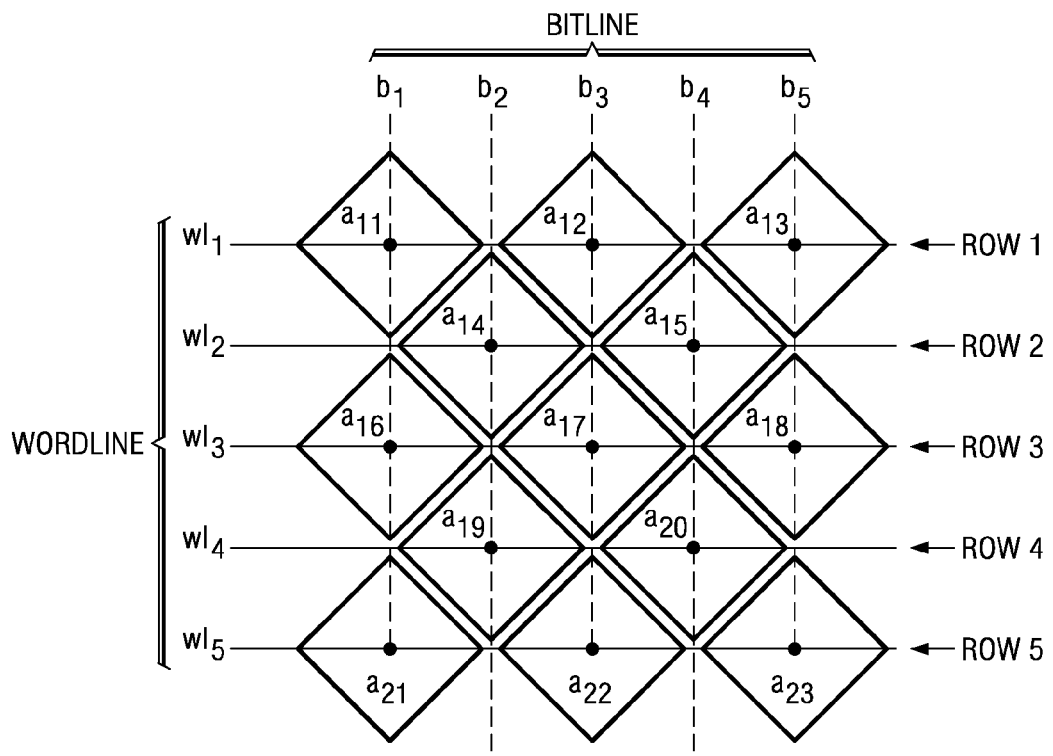
FIG. 20 is a perspective view of yet another spatial light modulator comprising an array of micromirror devices fabricated by the invention.

For the same micromirror array, the bitlines and wordlines can be deployed in other ways, such as that shown in FIG. 20. Referring to FIG. 20, each row of micromirrors is provided with one wordline and one bitline. Specifically, bitlines $b_1$, $b_2$, $b_3$, $b_4$ and $b_5$ respectively connect column 1 (comprising micromirrors $a_{11}$, $a_{16}$, and $a_{21}$), column 2 (comprising micromirrors $a_{14}$ and $a_{19}$), column 3 (comprising micromirrors $a_{12}$, $a_{17}$, and $a_{22}$), column 4 (comprising micromirrors $a_{15}$ and $a_{20}$), and column 5 (comprising micromirrors $a_{13}$, $a_{18}$, and $a_{23}$). Wordlines $WL_1$, $WL_2$, $WL_3$, $WL_4$, and $WL_5$ respectively connect row 1 (comprising micromirrors $a_{11}$, $a_{12}$, and $a_{13}$), row 2 (comprising micromirrors $a_{14}$ and $a_{15}$), row 3 (comprising micromirrors $a_{16}$, $a_{17}$, and $a_{18}$), row 4 (comprising micromirrors $a_{19}$ and $a_{20}$) and row 5 (comprising micromirrors $a_{21}$, $a_{22}$, and $a_{23}$).

Figure 21A:
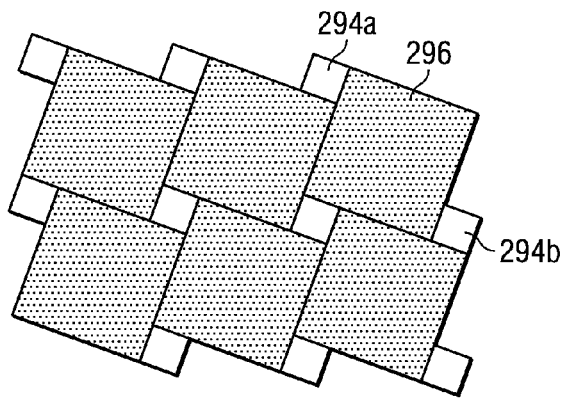
FIG. 21*a* is a top view of an array of exemplary addressing electrodes.
Figure 21B:
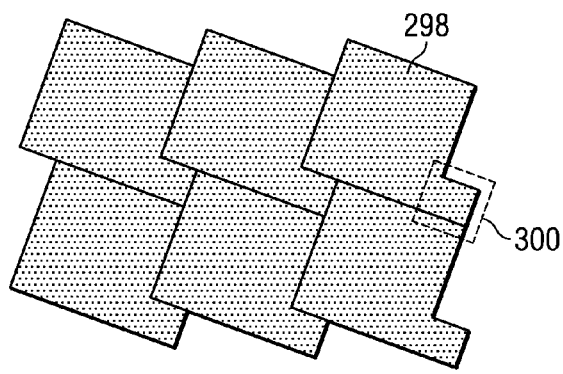
FIG. 21*b* is a top view of an array of exemplary mirror plates.
Figure 21C:
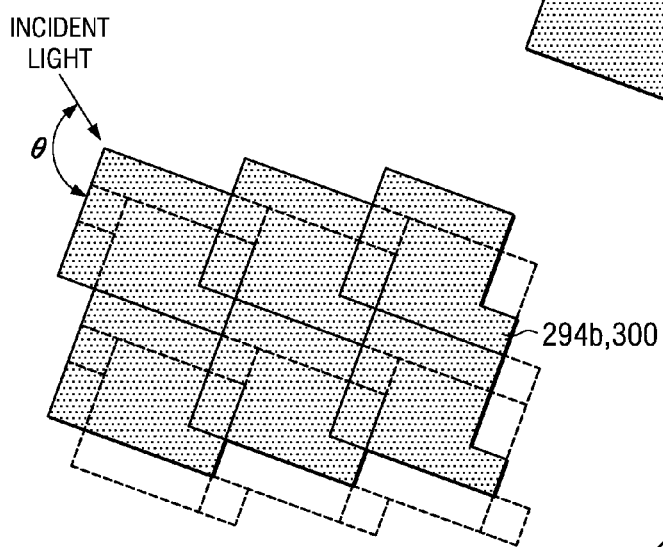
FIG. 21*c* is a top view of the addressing electrodes and mirror plates in FIGS. 21*a* and 21*b* after assembly.

According to another embodiment of the invention, the mirror plates of the micromirrors in the array can form a plurality of pockets, in which posts can be formed, wherein the pockets are covered by the extended areas of the addressing electrodes when viewed from the top of the micromirror array device, as shown in FIGS. 21a to 21c.

Referring to FIG. 21a, a portion of an array of mirror plates of the micromirrors is illustrated therein. The mirror plates in the array form a plurality of pockets in between. For example, pockets 294a and 294b are formed in which posts for supporting and holding mirror plate 296 can be formed. For individually addressing and deflecting the mirror plates in FIG. 21a, an array of addressing electrodes is provided, a portion of which is illustrated in FIG. 21b.

Referring to FIG. 21b, each addressing electrode has an extended portion, such as extended portion 300 of addressing electrode 298. Without the extended portion, the addressing electrode can be generally square, but having an area equal to or smaller than the mirror plate.

FIG. 21c illustrates a top view of a micromirror array device after the addressing electrodes in FIG. 21b and the mirror plates in FIG. 21a have been assembled together. It can be seen in the figure that each addressing electrode is displaced a particular distance along a diagonal of the mirror plate associated with the addressing electrode. As a result, the pockets presented between mirror plates are covered by the addressing electrode, specifically by the extended portions of the addressing electrodes. In this way, light scattering otherwise occurring in the substrate having the addressing electrodes can be removed. The quality, such as the contrast ratio of the displayed images can be improved.

When used in a spatial light modulator of a display system, the incident light beam is directed onto the mirror plates in a direction along the displacement direction of the addressing electrodes when viewed from the top of the addressing electrodes as shown in the figure. For example, the incident light has an angle θ to an edge of the addressing electrode (or the mirror plate) when viewed from the top; and the angle can be 135° degrees.

Figure 22:
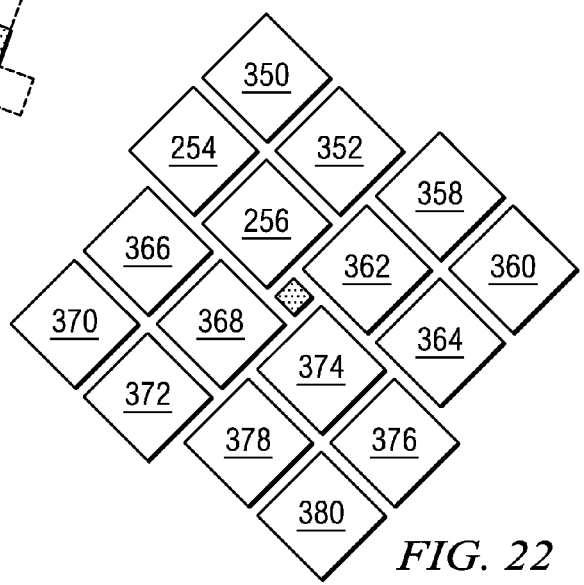
FIG. 22 is a top view of yet another exemplary micromirror device.
Figure 23:
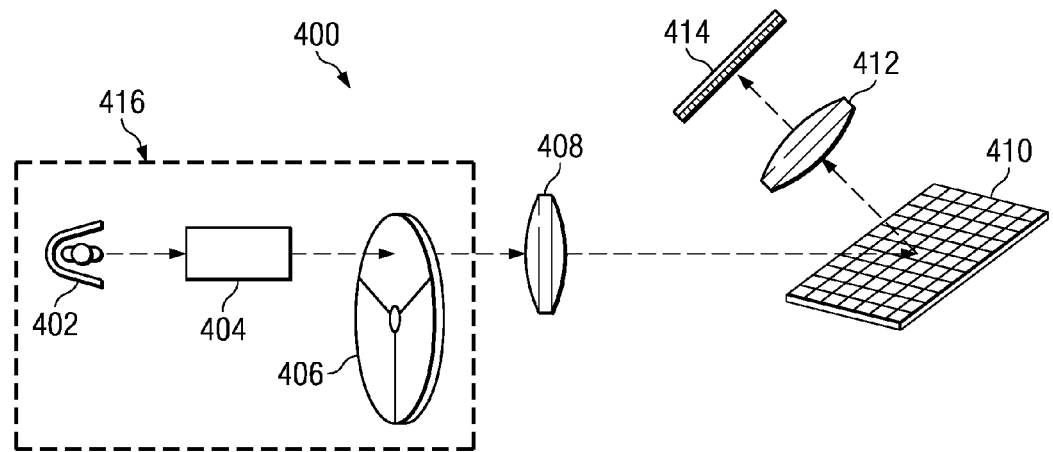
FIG. 23 demonstratively illustrates an exemplary display system having a spatial light modulator in which embodiments of the invention can be implemented.

In accordance with another embodiment of the invention, not all the micromirror devices of a spatial light modulator have posts (e.g. as that set forth in U.S. patent application Ser. No. 10/969,251 and Ser. No. 10/969,503 both filed Oct. 19, 2004, the subject matter of each being incorporated herein by reference in the entirety. An example of such micromirror array device is illustrated in a top view in FIG. 22. For simplicity purposes, only sixteen micromirror devices of the micromirror array device are illustrated. In this specific example, every four adjacent micromirrors are formed into a micromirror group, such as the group comprising micromirrors 350, 352, 254, and 356, the group comprising 358, 360, 362, and 364, the group comprising micromirrors 366, 368, 370, and 372, and the group comprising micromirrors 374, 376, 378 and 380. Adjacent groups (e.g. the above four micromirror groups) share a post that is represented by the black square for supporting the mirror plates of the micromirrors in the four micromirror groups. The exposed surface of the post can be covered by a light blocking film. In general, the posts of a micromirror array device, wherein not all micromirrors are provided with a post, can all be coated with light blocking pads. Alternatively, only a number of (but not all) the posts are coated with light blocking pads. FIG. 23 schematically illustrates an exemplary display system that employs a spatial light modulator in which embodiment of the invention can be implemented. In this particular example, display system 400 comprises light source illumination system 416, group lens 408, spatial light modulator 410, projection lens 412, and display target 414. The illumination system may further comprise light source 402, light pipe 404, and color filter 406 such as a color wheel. Alternative to the illumination system 416 as shown in the figure wherein the color wheel is positioned after the light pipe along the propagation path of the illumination light from the light source, the color wheel can also be positioned between the light source and light pipe at the propagation path of the illumination light. The illumination light can be polarized or non-polarized. When polarized illumination light is used, display target 414 may comprise a polarization filter associated with the polarized illumination light, as set forth in U.S. provisional patent application Ser. No. 60/577,422 filed Jun. 4, 2004, the subject matter being incorporated herein by reference.

The light source can be any suitable light source, such as an arc lamp, preferably an arc lamp with a short arc for obtaining intensive illumination light. The light source can also be an arc lamp with a spiral reflector, as set forth in U.S. patent application Ser. No. 11/055,654 filed Feb. 9, 2005, the subject matter being incorporated herein by reference.

The lightpipe (404) can be a standard lightpipe that are widely used in digital display systems for delivering homogenized light from the light source to spatial light modulators. Alternatively, the lightpipe can be the one with movable reflective surfaces, as set forth in U.S. patent provisional application Ser. No. 60/620,395 filed Oct. 19, 2004, the subject matter being incorporated herein by reference.

The color wheel (406) comprises a set of color and/or white segments, such as red, green, blue, or yellow, cyan, and magenta. The color wheel may further comprise a clear or non-clear segment, such as a high throughput or white segment for achieving particular purposes, as set forth in U.S. patent application Ser. No. 10/899,637, and Ser. No. 10/899,635 both filed Jul. 26, 2004, the subject matter of each being incorporated herein by reference, which will not be discussed in detail herein.

Figure 24:
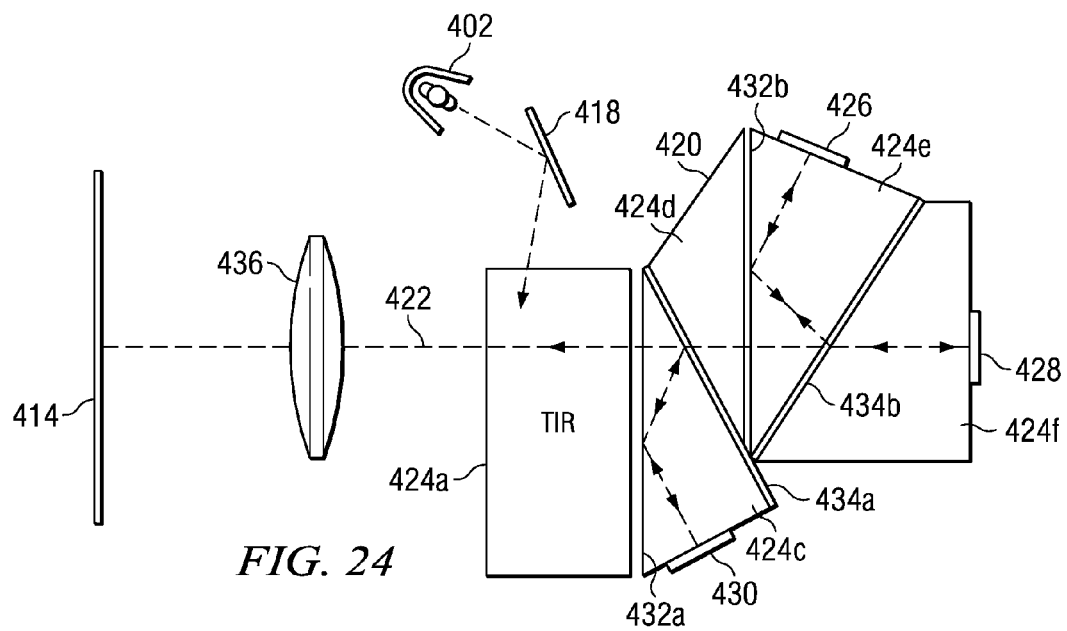
FIG. 24 demonstratively illustrates another exemplary display system having multiple spatial light modulators in each of which embodiments of the invention can be implemented.

The display system in FIG. 24 employs one spatial light modulator. However, a display system may use multiple spatial light modulators for modulating the illumination light of different colors. One of such display systems is schematically illustrated in FIG. 24. Referring to FIG. 24, the display system uses a dichroic prism assembly 420 for splitting incident light into three primary color light beams. Dichroic prism assembly comprises TIR 424*a*, 424*c*, 424*d*, 424*e* and 424*f*. Totally-internally-reflection (TIR) surfaces, i.e. TIR surfaces 434*a* and 434*b*, are defined at the prism surfaces that face air gaps. The surfaces 432*a* and 432*b* of prisms 424*c* and 424*e* are coated with dichroic films, yielding dichroic surfaces. In particular, dichroic surface 432*a* reflects green light and transmits other light. Dichroic surface 432*b* reflects red light and transmits other light. The three spatial light modulators, 430, 426 and 428, each having a micromirror array device, are arranged around the prism assembly.

In operation, incident white light 418 from light source 402 enters into TIR 424*a* and is directed towards spatial light modulator 428, which is designated for modulating the blue light component of the incident white light. At the dichroic surface 432*a*, the green light component of the totally internally reflected light from TIR surface 434*a* is separated therefrom and reflected towards spatial light modulator 430, which is designated for modulating green light. As seen, the separated green light may experience TIR by TIR surface 434*b* in order to illuminate spatial light modulator 430 at a desired angle. This can be accomplished by arranging the incident angle of the separated green light onto TIR surface 434*b* larger than the critical TIR angle of TIR surface 434*b*. The rest of the light components, other than the green light, of the reflected light from the TIR surface 434*a* pass through dichroic surface 432*a* and are reflected at dichroic surface 432*b*. Because dichroic surface 432*b* is designated for reflecting red light component, the red light component of the incident light onto dichroic surface 432*b* is thus separated and reflected onto spatial light modulator 426, which is designated for modulating red light. Finally, the blue component of the white incident light (white light 418) reaches spatial light modulator 428 and is modulated thereby. By collaborating operations of the three spatial light modulators, red, green, and blue lights can be properly modulated. The modulated red, green, and blue lights are recollected and delivered onto display target 414 through optic elements, such as projection lens 436, if necessary.

Figure 25:
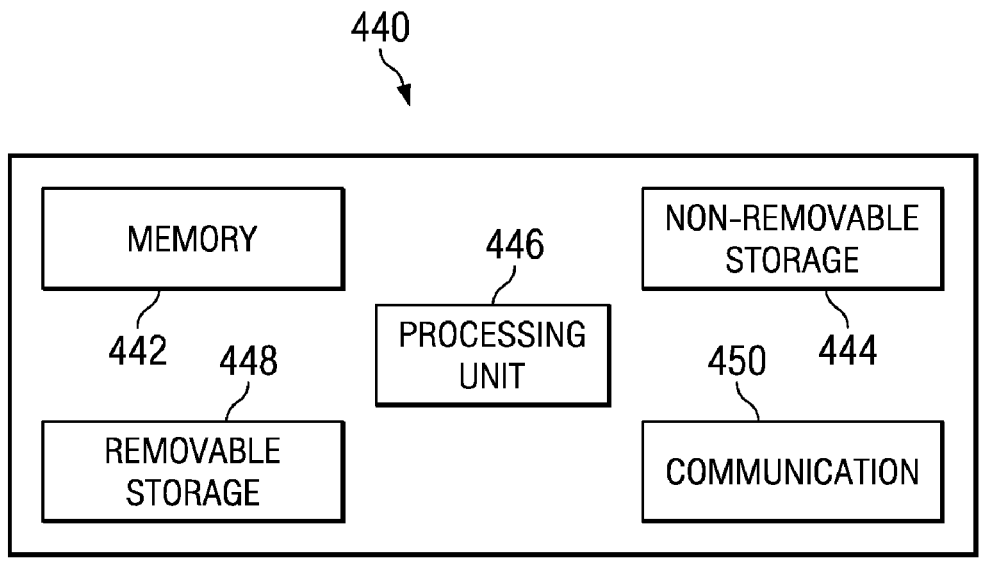
FIG. 25 is an exemplary computing device for use in the processing system of FIG. 10 and FIG. 11.

The above discussed cleaning and SAM coating processes can be implemented in a computing device, such as computing device 440 in FIG. 25. Specifically, the computing device controls the components of the processing system based on the interaction with users, or based on the control information stored therein so as to perform the processing procedures. The control can be accomplished through executions of a plurality of computer readable instructions generated from a plurality of functional modules. FIG. 25 schematically illustrates one exemplary computing device for implementing embodiments of the invention. Although such devices are well known to those of skill in the art, a brief explanation will be provided herein for the convenience of other readers.

Referring to FIG. 25, in its most basic configuration, computing device 440 typically includes at least one processing unit 446 and memory 442. Depending on the exact configuration and type of computing device, memory 442 can be volatile (such as RAM), non-volatile (such as ROM, flash memory, etc) or some combination of the two.

Additionally, computing device 440 may also have other features and/or functionality. For example, the computing device could also include additional removable and/or non-removable storage including, but not limited to, magnetic or optical disks or tape, as well as writable electrical storage media. Such additional storage is illustrated in FIG. 25 by removable storage 448 and non-removable storage 444. Computer storage media includes volatile and nonvolatile, removable and non-removable media implemented in any method or technology for storage of information such as computer readable instructions, data structures, program modules or other data. The memory, the removable storage and the non-removable storage are all examples of computer storage media. Computer storage media includes, but is not limited to, RAM, ROM, EEPROM, flash memory or other memory technology, CDROM, digital versatile disks (DVD) or other optical storage, magnetic cassettes, magnetic tape, magnetic disk storage or other magnetic storage devices, or any other medium which can be used to store the desired information and which can accessed by the device. Any such computer storage media may be part of, or used in conjunction with, the device.

The device may also contain one or more communications connections 450 that allow the device to communicate with other devices (such as the other functional modules in FIG. 10 and FIG. 11). The communications connections carry information in a communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. As discussed above, the term computer readable media as used herein includes both storage media and communication media.

Figure 26:
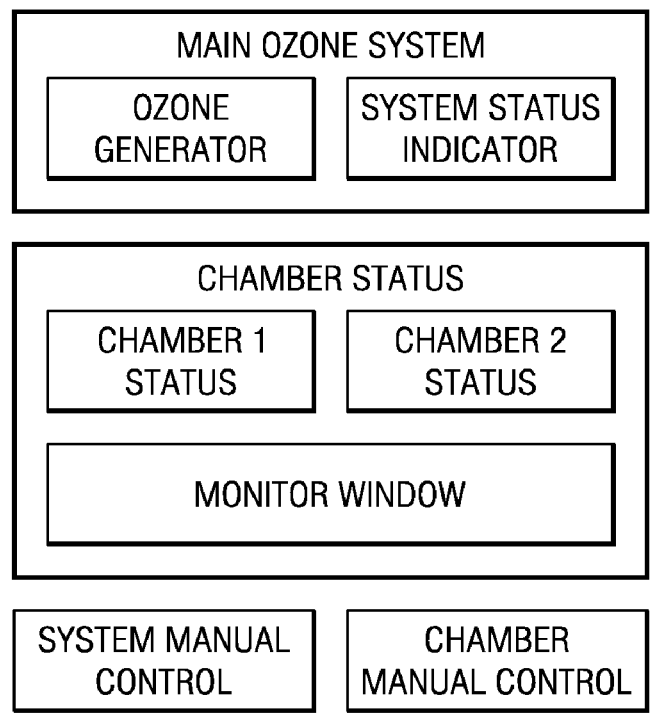
FIG. 26 illustrates an exemplary user interface implemented in the computing device of FIG. 25.

For facilitating the automatic control of the processing system for executing the desired processing procedures with the computing device, a set of User-Interfaces (UI) are provided according to the invention. FIG. 26 illustrates an exemplary user interface for executing the processing procedures in the invention. The under-interface comprises a Main-Ozone-System block for representing the major functions of the processing system. Specifically, the ozone generator block is included in the Main-Ozone-System for controlling and monitoring the operations of the system components related to generations of ozone gases. The system status indicator block provides necessary indications in any desired form to reflect the operation status of the system components.

Each block, including the ozone generator and system status indicator, provides functions of collecting instructions and data from the operators, and delivering such instructions and data to the corresponding system components so as to achieve dynamic control.

The Chamber Status block is provided for monitoring, controlling, and initiating the operations of the processing chambers. In this example wherein two processing chambers (as shown in FIG. 10 and FIG. 11) are provided, the chamber status block comprises chamber 1 status window and chamber 2 status window for the chambers, respectively. Each chamber status window, not only monitors the operation status of the associated processing chamber, but also enables dynamic control of the processing associated chamber.

A display window (the monitor) can also be provided for displaying any interested data and status. For example, the display window can be used for displaying the ozone concentration inside any one or both, or all processing chambers. Alternatively, the display chamber can be used to display the flow of the processing procedure.

For enabling the operator to manually control the processes, a manual control area is provided. In this area, instructions and data for the system components can be input and delivered to the corresponding system components accordingly. Similarly, a chamber manual control window can also be provided for enabling the manual control of the processing chambers individually or in combination.

Data generated from the processes and/or related to the processes can be collected from the system components, and stored, retrieved, and analyzed by the computing device as described with reference to FIG. 24. Specifically, an independent analyzing module can be programmed for analyzing the collected data. The analyzed data can be used as bases for controlling the processes, which will not be discussed in detail herein.

It will be appreciated by those skilled in the art that a new and useful releasing and post-releasing methods have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention.

We claim:

1. A method for fabricating a microelectromechanical system (MEMS) device, comprising:
   forming a first sacrificial material layer over a substrate;
   forming a movable member layer over the first sacrificial material layer;
   patterning the movable member layer to define a movable member;
   forming a second sacrificial material layer over the movable member and the first sacrificial material layer;
   patterning the second sacrificial material layer to form an opening;
   forming a hinge material layer over the patterned second sacrificial material layer;
   patterning the hinge material layer to define a hinge;
   after forming the hinge, removing the first and second sacrificial material layers thereby releasing the moveable member for movement about the hinge; the first and second sacrificial material layers being removed by a breakthrough etch for removing contaminants from the first and second sacrificial material layers, followed by a spontaneous etch that spontaneously and chemically reacts to remove the first and second sacrificial materials;
   following release of the moveable member, cleaning surfaces of the moveable member with a cleaning agent comprising a gas mixture containing ozone;
   following cleaning the surfaces, coating the surfaces with a self-atomic monolayer (SAM) coating; and
   after coating the surfaces, treating the surfaces with a lubricant, wherein the lubricant is applied with a silicon capillary tube, and wherein the capillary tube is baked prior to applying of the lubricant.

2. The method of claim 1, wherein the moveable member is hermetically sealed following application of the lubricant.

3. The method of claim 1, further comprising applying a bonding sealant circumferentially of the movable member to contain the movable member within an enclosed cavity of a package.

4. A method for fabricating a microelectromechanical system (MEMS) device, comprising:
   forming a first sacrificial material layer over a substrate;
   forming a movable member layer over the first sacrificial material layer;
   patterning the movable member layer to define a movable member;
   forming a second sacrificial material layer over the movable member and the first sacrificial material layer;
   patterning the second sacrificial material layer to form an opening;
   forming a hinge material layer over the patterned second sacrificial material layer;
   patterning the hinge material layer to define a hinge;
   after forming the hinge, removing the first and second sacrificial material layers thereby releasing the moveable member for movement about the hinge; the first and second sacrificial material layers being removed by a breakthrough etch for removing contaminants from the first and second sacrificial material layers, followed by a spontaneous etch that spontaneously and chemically reacts to remove the first and second sacrificial materials;
   following release of the moveable member, cleaning surfaces of the moveable member with a cleaning agent comprising a gas mixture containing ozone;
   following cleaning the surfaces, coating the surfaces with a self-atomic monolayer (SAM) coating; and
   applying a bonding sealant circumferentially of the movable member to contain the movable member within an enclosed cavity of a package;
   wherein the cleaning agent and the SAM coating are applied to the surfaces through an opening left by a discontinuity in the circumferential application of the bonding sealant.

5. The method of claim 4, further comprising, following cleaning and prior to coating with the SAM coating, coating the surfaces with a catalyst coating.

6. The method of claim 5, wherein the catalyst coating is $(OH)4P$.

7. The method of claim 4, wherein the cleaning agent comprises a humid ozone gas mixture and a dry ozone gas.

8. The method of claim 4, wherein the first and second sacrificial material layers comprise SiOx, and the breakthrough etch uses at least one of SiNx, $CF_4$ or $XeF_2$.

9. The method of claim 8, wherein the spontaneous etch uses a vapor phase etchant.

10. The method of claim 8, wherein the breakthrough etch and the spontaneous etch both use XeF2.

11. A method for fabricating a microelectromechanical system (MEMS) device, comprising:
    forming a first sacrificial material layer over a substrate;
    forming a movable member layer over the first sacrificial material layer;
    patterning the movable member layer to define a movable member;
    forming a second sacrificial material layer over the movable member and the first sacrificial material layer;
    patterning the second sacrificial material layer to form an opening;
    forming a hinge material layer over the patterned second sacrificial material layer;
    patterning the hinge material layer to define a hinge;
    after forming the hinge, removing the first and second sacrificial material layers thereby releasing the moveable member for movement about the hinge; the first and second sacrificial material layers being removed by a breakthrough etch for removing contaminants from the first and second sacrificial material layers, followed by a spontaneous etch that spontaneously and chemically reacts to remove the first and second sacrificial materials;
    following release of the moveable member, cleaning surfaces of the moveable member with a cleaning agent comprising a gas mixture containing ozone; and
    following cleaning the surfaces, coating the surfaces with a self-atomic monolayer (SAM) coating; and
    applying a bonding sealant circumferentially of the movable member to contain the mirror plate within an enclosed cavity of a package;
    wherein the cleaning agent and the SAM coating are applied to the surfaces through an opening left by a discontinuity in the circumferential application of the bonding sealant.

12. The method of claim 11, further comprising, following cleaning and prior to coating with the SAM coating, coating the surfaces with a catalyst coating comprising (OH)4P.

\* \* \* \* \*